United States Patent
Lee et al.

(10) Patent No.: US 11,877,450 B2
(45) Date of Patent: Jan. 16, 2024

(54) SEMICONDUCTOR MEMORY DEVICE

(71) Applicant: SAMSUNG ELECTRONICS CO., LTD., Suwon-si (KR)

(72) Inventors: So Hyeon Lee, Suwon-si (KR); Sung Su Moon, Hwaseong-si (KR); Jae Duk Lee, Seongnam-si (KR); Ik-Hyung Joo, Seongnam-si (KR)

(73) Assignee: Samsung Electronics Co., Ltd.

( * ) Notice: Subject to any disclaimer, the term of this patent is extended or adjusted under 35 U.S.C. 154(b) by 277 days.

(21) Appl. No.: 17/158,494

(22) Filed: Jan. 26, 2021

(65) Prior Publication Data

US 2022/0013538 A1 Jan. 13, 2022

(30) Foreign Application Priority Data

Jul. 9, 2020 (KR) .................... 10-2020-0084741

(51) Int. Cl.
*H10B 43/27* (2023.01)
*H01L 23/522* (2006.01)
*H10B 41/10* (2023.01)
*H10B 41/27* (2023.01)
*H10B 41/40* (2023.01)
*H10B 43/10* (2023.01)
*H10B 43/40* (2023.01)

(52) U.S. Cl.
CPC ......... *H10B 43/27* (2023.02); *H01L 23/5226* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/27; H10B 41/10; H10B 43/10; H01L 23/5226
See application file for complete search history.

(56) References Cited

U.S. PATENT DOCUMENTS

| | | |
|---|---|---|
| 9,524,903 B2 | 12/2016 | Lee |
| 9,911,750 B2 | 3/2018 | Lee |
| 9,960,181 B1 | 5/2018 | Cui et al. |
| 9,991,271 B2 | 6/2018 | Kang et al. |
| 10,283,566 B2 | 5/2019 | Sel et al. |
| 10,381,362 B1 * | 8/2019 | Cui ........................ H10B 43/40 |
| 10,515,897 B2 * | 12/2019 | Nishikawa ............. H10B 43/35 |
| 10,685,975 B2 * | 6/2020 | Baek ................. H01L 21/76802 |
| 10,777,501 B2 * | 9/2020 | Nakajima ............. H01L 23/535 |
| 10,797,066 B2 * | 10/2020 | Lee ........................ H10B 43/50 |

(Continued)

FOREIGN PATENT DOCUMENTS

KR 20190140253 A 12/2019

*Primary Examiner* — Bac H Au
(74) *Attorney, Agent, or Firm* — Fish & Richardson P.C.

(57) ABSTRACT

A semiconductor memory device includes; a first stacked structure including a first staircase portion, a second stacked structure on the first stacked structure and including a second staircase portion overlapping the first staircase portion, a first contact plug penetrating the first stacked structure and the second stacked structure, electrically connected to the first stacked structure and not electrically connected to the second stacked structure, and a second contact plug penetrating the first stacked structure and the second stacked structure, electrically connected to the second stacked structure and not electrically connected to the first stacked structure.

20 Claims, 26 Drawing Sheets

(56) References Cited

U.S. PATENT DOCUMENTS

| | | | |
|---|---|---|---|
| 2017/0236746 A1* | 8/2017 | Yu .......................... | H10B 43/40 |
| | | | 257/314 |
| 2017/0263642 A1* | 9/2017 | Nishikawa ............. | H10B 41/35 |
| 2017/0352678 A1* | 12/2017 | Lu .......................... | H10B 43/10 |
| 2019/0378855 A1 | 12/2019 | Kim et al. | |

* cited by examiner

SEMICONDUCTOR MEMORY DEVICE

CROSS-REFERENCE TO RELATED APPLICATION

This U.S. non-provisional patent application claims the benefit of priority under 35 U.S.C. § 119 to Korean Patent Application No. 10-2020-0084741 filed on Jul. 9, 2020 in the Korean Intellectual Property Office, the subject matter of which is hereby incorporated by reference.

BACKGROUND

1. Technical Field

The inventive concept relates generally to semiconductor memory devices.

2. Description of the Related Art

In order to satisfy consumer demands for superior performance and inexpensive prices, it is desired to increase the integration density of semiconductor devices. In a semiconductor device, since the integration density thereof is an important factor in determining the price of a product, an increased integration density is particularly required. In the case of two-dimensional or planar semiconductor devices, since their integration density is mainly determined by the area occupied by a unit memory cell, it is greatly influenced by the level of a fine pattern forming technology.

However, since extremely high-priced equipment is required for the miniaturization of patterns, the integration density of the two-dimensional semiconductor devices has been increased but is still limited. Accordingly, three-dimensional semiconductor memory devices having memory cells arranged three-dimensionally have been proposed.

SUMMARY

Embodiments of the inventive concept provide semiconductor memory devices having relatively reduced size.

Certain embodiments of the inventive concept provide a semiconductor memory device including: a first stacked structure on a substrate, the first stacked structure including a cell region and a first staircase portion extending in a first direction, a second stacked structure on the first stacked structure, the second stacked structure including a second staircase portion extending in the first direction, the second staircase portion at least partially overlapping the first staircase portion in a second direction, a first contact plug on the first staircase portion and the second staircase portion, the first contact plug penetrating the first stacked structure and the second stacked structure and extending in the second direction, wherein the first contact plug is electrically connected to the first stacked structure, and is not electrically connected to the second stacked structure, and a second contact plug on the first staircase portion and the second staircase portion, the second contact plug penetrating the first stacked structure and the second stacked structure and extending in the second direction, wherein the second contact plug is electrically connected to the second stacked structure, and is not electrically connected to the first stacked structure.

Certain embodiments of the inventive concept provide a semiconductor memory device including: a first stacked structure on a substrate, the first stacked structure including a cell region and a first staircase portion extending in a first direction, a second stacked structure on the first stacked structure, the second stacked structure including a second staircase portion extending in the first direction, the second staircase portion at least partially overlapping the first staircase portion in a second direction, and a first contact plug and a second contact plug on the first staircase portion and the second staircase portion, the first contact plug and the second contact plug penetrating the first stacked structure and the second stacked structure, wherein the first stacked structure includes first electrode pads stacked in the second direction, the second stacked structure includes second electrode pads stacked in the second direction, one of the first electrode pads surrounds an outer surface of the first contact plug, and one of the second electrode pads surrounds an outer surface of the second contact plug.

Certain embodiments of the inventive concept provide a semiconductor memory device including: a peripheral circuit structure including a peripheral circuit, and a cell array structure including a first stacked structure including a first staircase portion extending in a first direction, a second stacked structure on the first stacked structure, the second stacked structure including a second staircase portion extending in the first direction, the second staircase portion at least partially overlapping the first staircase portion in a second direction, and a first contact plug and a second contact plug on the first staircase portion and the second staircase portion, the first contact plug and the second contact plug penetrating the first stacked structure and the second stacked structure and being connected to the peripheral circuit, wherein the first contact plug is electrically connected to the first stacked structure and is not electrically connected to the second stacked structure, the second contact plug is electrically connected to the second stacked structure, and is not electrically connected to the first stacked structure, and the first contact plug and the second contact plug are alternately disposed in the first direction.

BRIEF DESCRIPTION OF THE DRAWINGS

The above and other aspects and features of the inventive concept will become more apparent upon consideration of certain embodiments described hereafter in relation to the accompanying drawings, in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
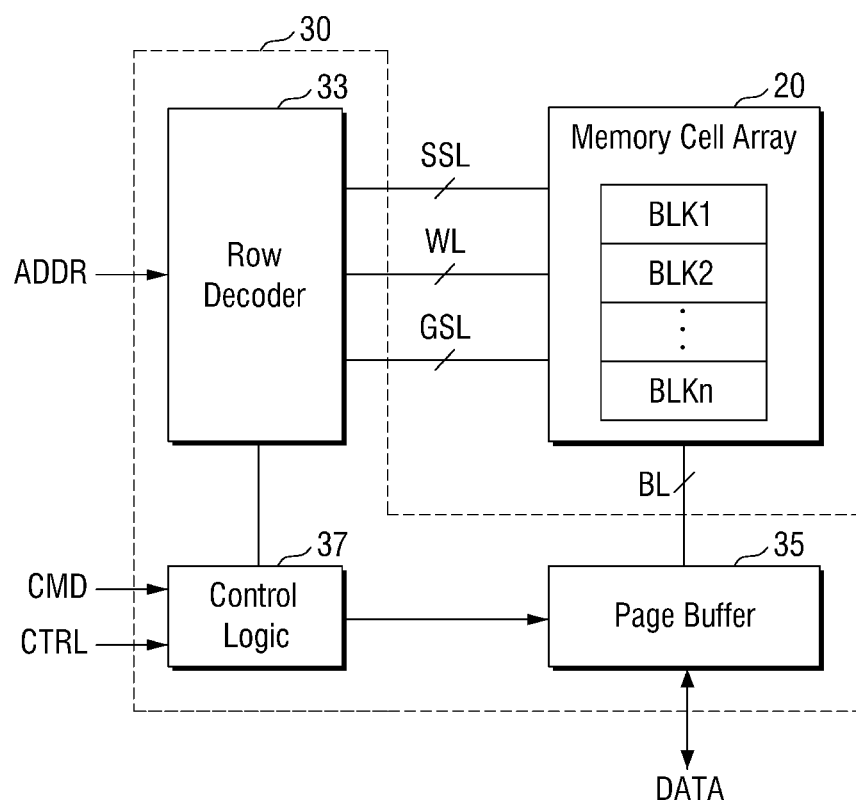
FIG. 1 is a block diagram illustrating a semiconductor memory device according to embodiments of the inventive concept.

Figure (FIG. 1 is a block diagram illustrating a semiconductor memory device 10 according to embodiments of the inventive concept.

Referring to FIG. 1, the semiconductor memory device 10 may generally include a memory cell array 20 and a peripheral circuit 30.

Here, the memory cell array 20 may include memory cell blocks BLK1 to BLKn, wherein each of the memory cell blocks BLK1 to BLKn may include memory cells. The memory cell blocks BLK1 to BLKn may be connected to the peripheral circuit 30 through bit lines BL, word lines WL, at least one of string select lines SSL and at least one of ground select lines GSL.

That is, the memory cell blocks BLK1 to BLKn may be connected to a row decoder 33 through the word lines WL, at least one of the string select lines SSL and at least one of the ground select lines GSL. Further, the memory cell blocks BLK1 to BLKn may be connected to a page buffer 35 through the bit lines BL.

The peripheral circuit 30 may receive one or more address(es) (ADDR), command(s) (CMD), control signal(s) (CTRL) and data signals (DATA) (hereafter, collectively or singularly CAD signals) from one or more external circuit(s). In response to various CAD signals the peripheral circuit 30 may communicate (e.g., transmit and/or receive) data with the external circuit(s). In some embodiments, the peripheral circuit 30 may include a control logic 37, the row decoder 33 and the page buffer 35.

Although not shown in FIG. 1, the peripheral circuit 30 may further include other components, such as input/output (I/O) circuit(s), voltage generation circuit(s) configured to generate various voltages required for the operation of the semiconductor memory device 10, and/or error correction circuit(s) configured to detect and/or correct error(s) in the communicated data (e.g., read data and/or write data).

In this regard, the control logic 37 may be connected to the row decoder 33, the voltage generation circuit(s), and/or the I/O circuit(s) in order to control the overall operation of the semiconductor memory device 10. The control logic 37 may generate various internal control signals used in the semiconductor memory device 10 in response to various CAD signals (e.g., one or more command(s) CMD and/or control signal(s) CTRL).

For example, the control logic 37 may adjust certain voltage level(s) associated with the word lines WL and/or bit lines BL during the execution of a memory operations, such as a program operation and an erase operation.

The row decoder 33 may select at least one of the memory cell blocks BLK1 to BLKn in response to a received address ADDR. Further, the row decoder 33 may select at least one of the word lines WL, at least one of the string select lines SSL and at least one of the ground select lines GSL associated with the selected memory block among the memory cell blocks BLK1 to BLKn. The row decoder 33 may transmit a voltage for performing a memory operation to the word lines WL of the selected at least one of the memory cell blocks BLK1 to BLKn.

The page buffer 35 may be connected to the memory cell array 20 through the bit lines BL. The page buffer 35 may operate as a writer driver or a sense amplifier. That is, during the program operation, the page buffer 35 may operate as a write driver to apply, to the bit lines BL, a voltage corresponding to the data (DATA) intended to be stored in the memory cell array 20. Alternately, during the read operation, the page buffer 35 may operate as a sense amplifier to sense the data (DATA) stored in the memory cell array 20.

Figure 2:
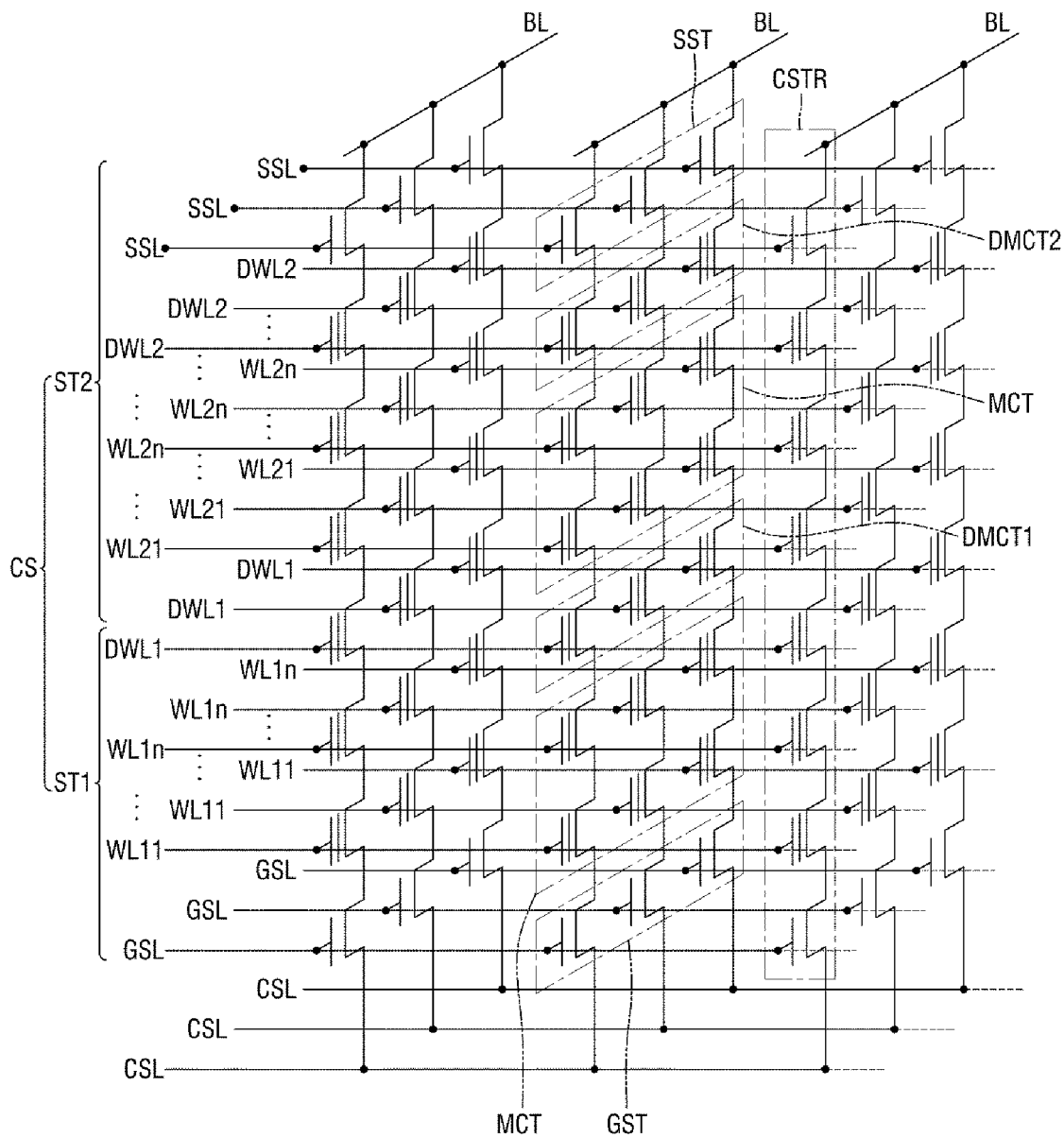
FIG. 2 is a circuit diagram further illustrating in part a semiconductor memory device according to embodiments of the inventive concept.

FIG. 2 is a circuit diagram further illustrating in relevant part a memory cell array of a semiconductor memory device according to embodiments of the inventive concept.

Referring to FIG. 2, the memory cell array may include a common source line CSL, stacked structures ST1 and ST2, bit lines BL, and cell strings CSTR.

The stacked structures ST1 and ST2 may include a first stacked structure ST1 and a second stacked structure ST2 disposed on the first stacked structure ST1. The first stacked structure ST1 may include a ground select line GSL, and a group of lower word lines WL11 to WL1n and DWL1. The second stacked structure ST2 may include a group of upper word lines WL21 to WL2n and DWL2, and a string select line SSL. Although the two stacked structures ST1 and ST2 are shown in FIG. 2, the inventive concept is not limited thereto, and instead, three or more stacked structures may be included.

The cell strings CSTR may be respectively connected to the bit lines BL in parallel. The cell strings CSTR may be commonly connected to the common source lines CSL. That is, the cell strings CSTR may be disposed between the bit lines BL and one common source line CSL. The common source lines CSL may be arranged two-dimensionally. The same voltage may be applied to the common source lines CSL. Alternately, different voltages may be applied to the common source lines CSL to be controlled separately.

Each of the cell strings CSTR may include, for example, a ground select transistor GST connected to the common source line CSL, a string select transistor SST connected to each of the bit lines BL, and memory cell transistors MCT disposed between the ground select transistor GST and the string select transistor SST. That is, the ground select transistor GST, the string select transistor SST, and the memory cell transistors MCT may be connected in series. Each of the memory cell transistors MCT may include a data storage element.

Each of the cell strings CSTR may further include dummy cell transistors DMCT1 and DMCT2 connected between the string select transistor SST and the memory cell transistor MCT. Although not illustrated in FIG. 2, each of the cell strings CSTR may further include dummy cell transistors connected between the ground select transistor GST and the memory cell transistor MCT. Further, each of the cell strings CSTR may further include a gate induced drain leakage (GIDL) transistor connected between the common source line CSL and the ground select line GSL.

The common source line CSL may be commonly connected to the sources of the ground select transistors GST. In addition, gate electrodes (e.g., the ground select line GSL, word lines WL1 to WLn and WL21 to WL2n and the string select line SSL) may be disposed between the common source line CSL and each of the bit lines BL.

The ground select line GSL may be used as a gate electrode of the ground select transistor GST. The word lines WL11 to WL1n and WL21 to WL2n may be used as gate electrodes of the memory cell transistors MCT. The string select line SSL may be used as a gate electrode of the string select transistor SST.

Figure 3:
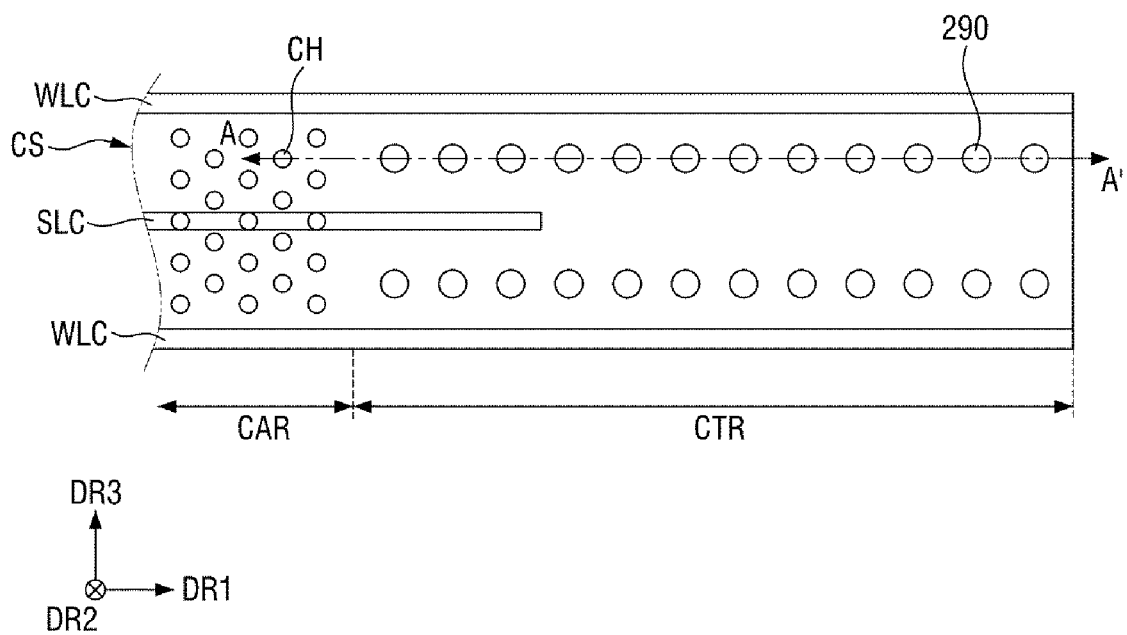
FIG. 3 is a layout (or top-down) diagram of a semiconductor memory device according to embodiments of the inventive concept.
Figure 4:
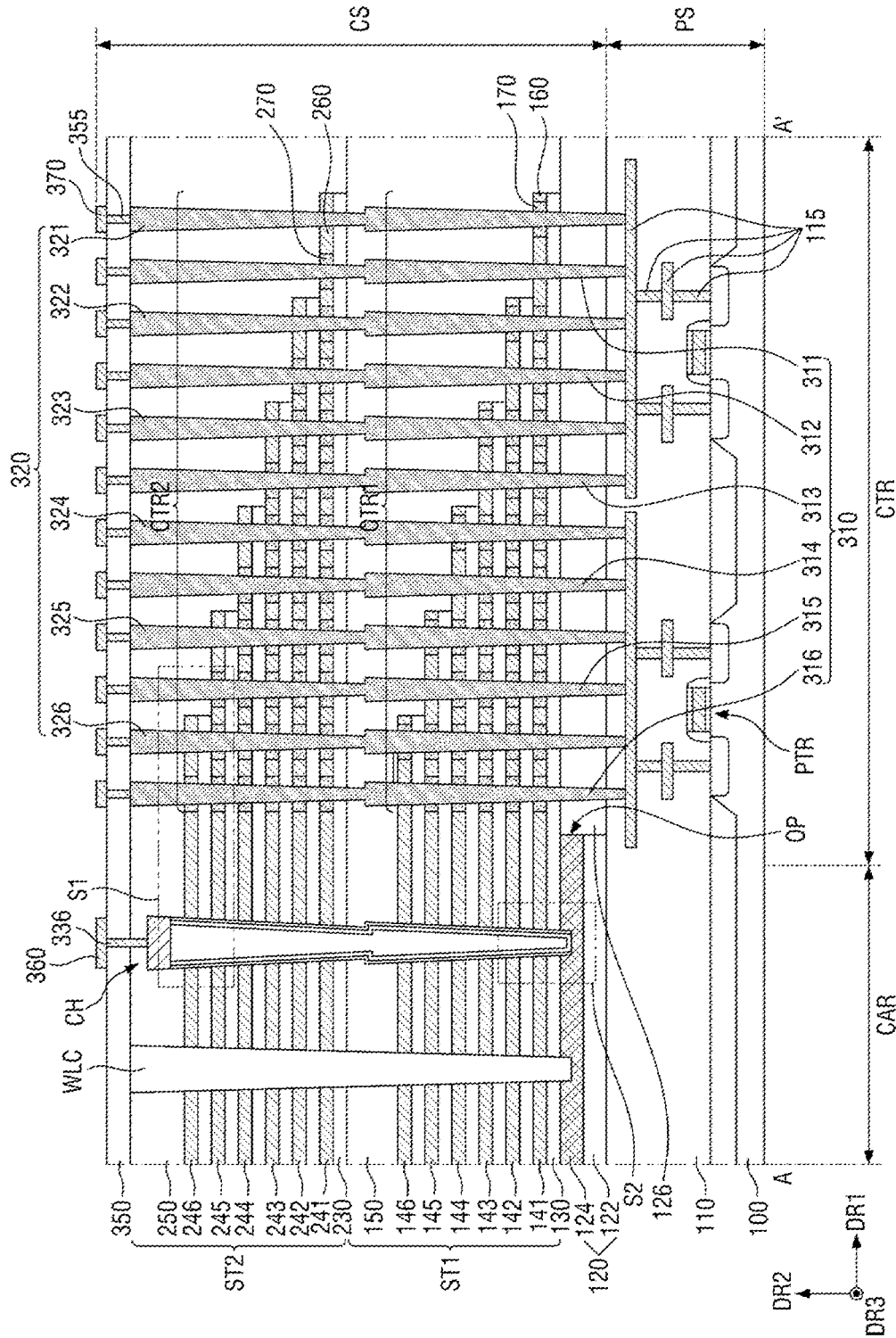
FIG. 4 is a cross-sectional view taken along line A-A' of FIG. 3.

FIG. 3 is a layout diagram (or top-down view) of a semiconductor memory device according to embodiments of the inventive concept, and FIG. 4 is a cross-sectional view taken along line A-A' of FIG. 3.

Referring to FIGS. 3 and 4, a semiconductor memory device according to embodiments of the inventive concept may further include a peripheral circuit structure PS and a cell array structure CS.

The peripheral circuit structure PS may include a peripheral circuit PTR, a peripheral logic insulating layer 110 and a first wiring connector 115.

The peripheral circuit PTR may be formed on a first substrate 100. The peripheral circuit PTR may be included in the page buffer 35 of FIG. 1 and the row decoder 33 of FIG. 1.

Here, the first substrate 100 may be a bulk silicon or silicon-on-insulator (SOI) substrate. Alternately, the first substrate 100 may be a silicon substrate or may include other materials such as silicon germanium, silicon germanium on insulator (SGOI), indium antimonide, a lead tellurium compound, indium arsenide, indium phosphide, gallium arsenide, or gallium antimonide, but the inventive concept is not limited thereto.

The peripheral logic insulating layer 110 may be formed on the first substrate 100. The peripheral logic insulating layer 110 may include, for example, at least one of silicon oxide, silicon nitride or silicon oxynitride.

The first wiring connector 115 may be formed in the peripheral logic insulating layer 110. The first wiring connector 115 may be connected to the peripheral circuit PTR.

The cell array structure CS may include a horizontal semiconductor layer 120 on the peripheral circuit structure PS, a first stacked structure ST1 on the horizontal semiconductor layer 120, and a second stacked structure ST2 on the first stacked structure ST1. The horizontal semiconductor layer 120, the first stacked structure ST1, and the second stacked structure ST2 may be sequentially stacked in a second direction DR2. Although the two stacked structures disposed on the horizontal semiconductor layer 120 are illustrated in some of the accompanying drawings, the inventive concept is not limited thereto, and three or more stacked structures may be disposed on the horizontal semiconductor layer 120 in other embodiments of the inventive concept.

The cell array structure CS may include a cell region CAR and a cell contact region CTR including first and second staircase portions CTR1 and CTR2. The cell region CAR may be a region corresponding to the memory cell array 20 of FIG. 2, and the cell contact region CTR may be a region for electrically connecting the memory cell array 20 of FIG. 2 to the peripheral circuit 30.

The horizontal semiconductor layer 120 may be disposed on the peripheral circuit structure PS. The horizontal semiconductor layer 120 may extend along a top surface of the peripheral circuit structure PS. The horizontal semiconductor layer 120 may include an opening OP exposing part of the peripheral circuit structure PS.

The horizontal semiconductor layer 120 may include a lower supporting semiconductor layer 122 and a common source plate 124 on the lower supporting semiconductor layer 122. The horizontal semiconductor layer 120 may include, for example, at least one of silicon (Si), germanium (Ge), silicon germanium (SiGe), gallium arsenide (GaAs), indium gallium arsenide (InGaAs), aluminum gallium arsenide (AlGaAs), or a mixture thereof. The horizontal semiconductor layer 120 may have a crystal structure including at least one selected from monocrystal, amorphous, and polycrystal structures.

The common source plate 124 may serve as the common source line CSL of FIG. 2.

In contrast to the illustrated example of FIGS. 3 and 4, the entire horizontal semiconductor layer 120 may be the common source plate 124 not including the lower supporting semiconductor layer 122. Alternately, the common source plate 124 may be a common source line having a line shape extending in a first direction DR1, rather than a two-dimensional planar shape, which is formed in the horizontal semiconductor layer 120.

A filling insulating layer 126 may be formed on the peripheral circuit structure PS. The filling insulating layer 126 may fill the opening OP. The filling insulating layer 126 may include, for example, silicon oxide, but is not limited thereto.

The first stacked structure ST1 may include first electrode pads 141 to 146 stacked in the second direction DR2, first insulating layers 130 disposed between the first electrode pads 141 to 146, and a first interlayer insulating layer 150 covering the first electrode pads 141 to 146 and the first insulating layers 130. Here, the first stacked structure ST1 includes six (6) electrode pads for the sake of clarity, but the inventive concept is not limited thereto.

The first electrode pads 141 to 146 may extend in the first direction DR1 and may include the first staircase portion CTR1 having steps that extend in different lengths. Thus, the lengths of the first electrode pads 141 to 146 may be decreased in the second direction DR2.

The second stacked structure ST2 may include second electrode pads 241 to 246 stacked in the second direction DR2, second insulating layers 230 disposed between the second electrode pads 241 to 246, and a second interlayer insulating layer 250 covering the second electrode pads 241 to 246 and the second insulating layers 230 on the first interlayer insulating layer 150. Here again, for the sake of clarity, the second stacked structure ST2 is illustrated as including only six (6) electrode pads, but the inventive concept is not limited thereto.

The second electrode pads 241 to 246 may extend in the first direction DR1 and may include the second staircase portion CTR2 having steps that extend in different lengths. Thus, the lengths of the second electrode pads 241 to 246 may be decreased in the second direction DR2.

At least part of the second staircase portion CTR2 may overlap the first staircase portion CTR1 in the second direction DR2. For example, the lowermost second electrode pad 146 among the second electrode pads 241 to 246 may extend further in the first direction DR1 than the uppermost first electrode pad 146 among the first electrode pads 141 to 146. That is, the length of the lowermost second electrode pad 241 may be relatively longer than that of the uppermost first electrode pad 146.

Each of the first electrode pads 141 to 146 may include a first conductive region 160 and a first insulating region 170. Each of the second electrode pads 241 to 246 may include a second conductive region 260 and a second insulating region 270.

The first and second conductive regions 160 and 260 may be disposed in the cell region CAR and the cell contact region CTR, and the first and second insulating regions 170 and 270 may be disposed in the cell contact region CTR. The first conductive region 160 and the first insulating region 170 may be alternately disposed in the first direction DR1 in the cell contact region CTR. The second conductive region 260 and the second insulating region 270 may be alternately disposed in the first direction DR1 in the cell contact region CTR.

The first and second insulating regions 170 and 270 may be arranged in the second direction DR2. The first and second insulating regions 170 and 270 may be disposed at positions corresponding to each other in the second direction DR2.

The first conductive region 160 may at least partially surround a first contact plug 310. The first conductive region 160 may contact an outer surface of the first contact plug 310. The first conductive region 160 may contact an outer surface of one first contact plug 310.

The first insulating region 170 may surround a second contact plug 320. The first insulating region 170 may contact an outer surface of the second contact plug 320.

The second conducive region 260 may contact the outer surface of the second contact plug 320. The second conductive region 260 may contact the outer surface of the second contact plug 320. The second conductive region 260 may contact an outer surface of one second contact plug 320.

The second insulating region 270 may surround the first contact plug 310. The second insulating region 270 may contact an outer surface of the first contact plug 310.

The first and second conductive regions 160 and 260 may include a conductive material. The first and second conductive regions 160 and 260 may include, for example, metal such as tungsten (W), cobalt (Co), and nickel (Ni), or a semiconductor material such as silicon, but are not limited thereto.

The first and second insulating layers 130 and 230 and the first and second insulating regions 170 and 270 may include an insulating material. The first and second insulating layers 130 and 230 and the first and second insulating regions 170 and 270 may include, for example, silicon oxide, but are not limited thereto.

The first and second contact plugs 310 and 320 may include the string select transistor SST, the gate electrode included in the ground select transistor GST, and the word line of the memory cell transistor MCT described with reference to FIG. 2.

The first and second contact plugs 310 and 320 may be disposed on the first and second staircase portions CTR1 and CTR2, respectively. The first and second contact plugs 310 and 320 may be arranged along the first direction DR1. The first and second contact plugs 310 and 320 may be arranged alternately along the first direction DR1.

The first and second contact plugs 310 and 320 may penetrate the first and second stacked structures ST1 and ST2, respectively. The first and second contact plugs 310 and 320 may be electrically connected to the peripheral circuit PTR of the peripheral circuit structure PS through the opening OP.

The first and second contact plugs 310 and 320 may extend in the second direction DR2. The first and second contact plugs 310 and 320 may have the same length in the second direction DR2.

The first contact plug 310 may be electrically connected to the first stacked structure ST1 without being electrically connected to the second stacked structure ST2. The first contact plug 310 may be electrically connected to the uppermost first electrode pad among the first electrode pads 141 to 146 while penetrating therethrough. That is, each of the first electrode pads 141 to 146 may be electrically connected to the outermost first contact plug 310.

For example, the first contact plug 310 may include first sub-contact plugs 311 to 316 spaced apart in the first direction DR1. At least some of the first sub-contact plugs 311 to 316 may be respectively connected to the first electrode pads 141 to 146.

That is, the first sub-contact plug 316 may penetrate the first conductive region 160 included in the uppermost first electrode pad 146, the first insulating regions 170 included in the first electrode pads 141 to 145 disposed below the uppermost first electrode pad 146, and the second insulating regions 270 included in the second electrode pads 241 to 246.

The second contact plug 320 may be electrically connected to the second stacked structure ST2 without being electrically connected to the first stacked structure ST1. The second contact plug 320 may be electrically connected to the uppermost second electrode pad among the second electrode pads 241 to 246 while penetrating therethrough. That is, each of the second electrode pads 241 to 246 may be electrically connected to the outermost second contact plug 320.

For example, the second contact plug 320 may include second sub-contact plugs 321 to 326 spaced apart in the first direction DR1. At least some of the second sub-contact plugs 321 to 326 may be respectively connected to the second electrode pads 241 to 246.

That is, the second sub-contact plug 326 may penetrate the second conductive region 260 included in the uppermost second electrode pad 246, the second insulating regions 270 included in the second electrode pads 241 to 245 disposed below the uppermost second electrode pad 246, and the first insulating regions 170 included in the first electrode pads 141 to 146.

Further, the first contact plug 310 may be connected to the first electrode pad, which is stacked at an 'nth' position ('n' being a natural number) in the second direction DR2, and the second contact plug 320 closest to the first contact plug 310 may be connected to the second electrode pad, which is stacked at an nth position in the second direction DR2. For example, the first sub-contact plug 313 may be connected to the first electrode pad 143 which is stacked thirdly, and the second sub-contact plug 323 closest to the first sub-contact plug 313 may be connected to the second electrode pad 243 which is stacked thirdly.

Although the first and second contact plugs 310 and 320 are shown as being alternately arranged in FIGS. 3 and 4 with respect to a channel structure CH, the inventive concept is not limited thereto. The second contact plug 320 and the first contact plug 310 may be alternately arranged with respect to the channel structure CH.

A cutting line WLC may be disposed in the first and second stacked structures ST1 and ST2. The cutting line WLC may penetrate the first and second stacked structures ST1 and ST2. The cutting lines WLC may be spaced apart in a third direction DR3.

The cutting line WLC may extend in the first direction DR1 to cut the first and second stacked structures ST1 and ST2. The cutting line WLC may cut the first electrode pads 141 to 146 and the second electrode pads 241 to 246.

The cutting line WLC may contain one or more insulating material(s), such as e.g., silicon oxide. In contrast to the foregoing, illustrated example, the cutting line WLC may include a liner formed along a sidewall of the word line WL and a filling layer on the liner. In some embodiments, the liner may contain an insulating material and the filling layer may contain a conductive material. Alternately, the liner may contain a conductive material and the filling layer may contain an insulating material.

A sub-cutting line SLC may be disposed between adjacent cutting lines WLC on the cell region CAR. At least one sub-cutting line SLC may be disposed between adjacent cutting lines WLC. The sub-cutting line SLC may extend in the first direction DR1. For example, the sub-cutting line SLC may have a linear shape.

The channel structure CH may be disposed on the cell region CAR. The channel structure CH may extend in the second direction DR2. The channel structure CH may penetrate the first and second stacked structures ST1 and ST2. Alternately, dummy channels may be further disposed at an end portion of the cell region CAR and the cell contact region CTR.

The third interlayer insulating layer 350 may be disposed on the second stacked structure ST2. The third interlayer insulating layer 350 may be disposed on the second interlayer insulating layer 250. The first to third interlayer insulating layers 150, 250, and 350 may include, for example, silicon oxide, but are not limited thereto.

A bit line 360 may be disposed on the third interlayer insulating layer 350. The bit line 360 may be electrically connected to the channel structure CH through a bit line contact 336 disposed in the third interlayer insulating layer 350.

An upper connection wiring 370 may be electrically connected to the first and second contact plugs 310 and 320 through an upper contact 355 disposed in the third interlayer insulating layer 350.

In a semiconductor memory device according to embodiments of the inventive concept, the first staircase portion CTR1 of the first stacked structure ST1 and the second staircase portion CTR2 of the second stacked structure ST2 may overlap in the second direction DR2, thereby allowing a reduction in the overall size of the semiconductor memory device.

Figure 5:
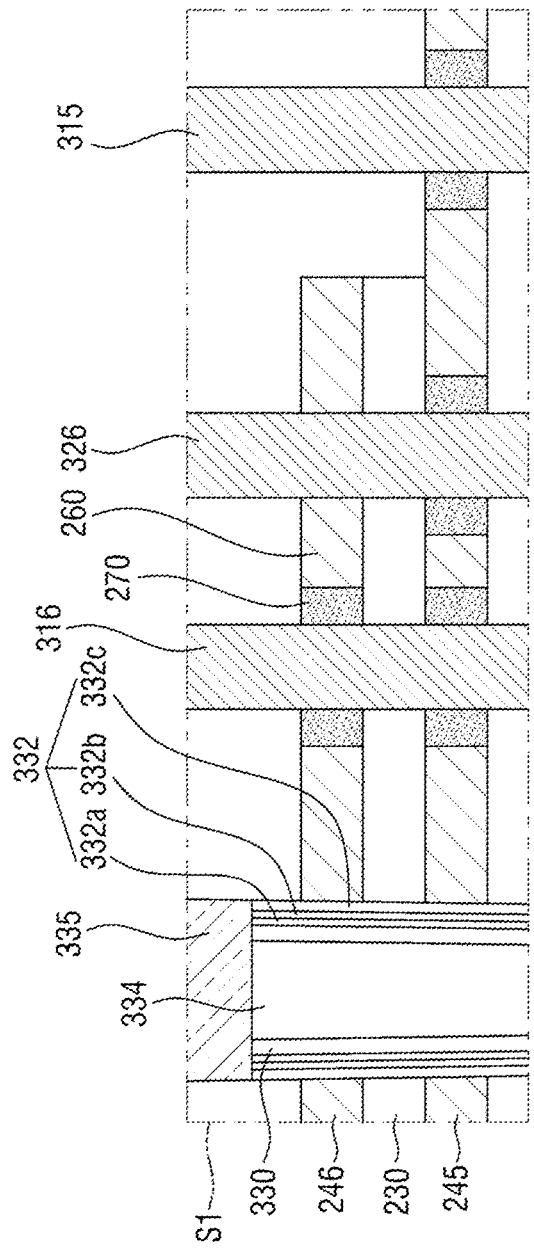
FIGS. 5, 6 and 7 are respective enlarged views of portion S1 of FIG. 4.
Figure 6:
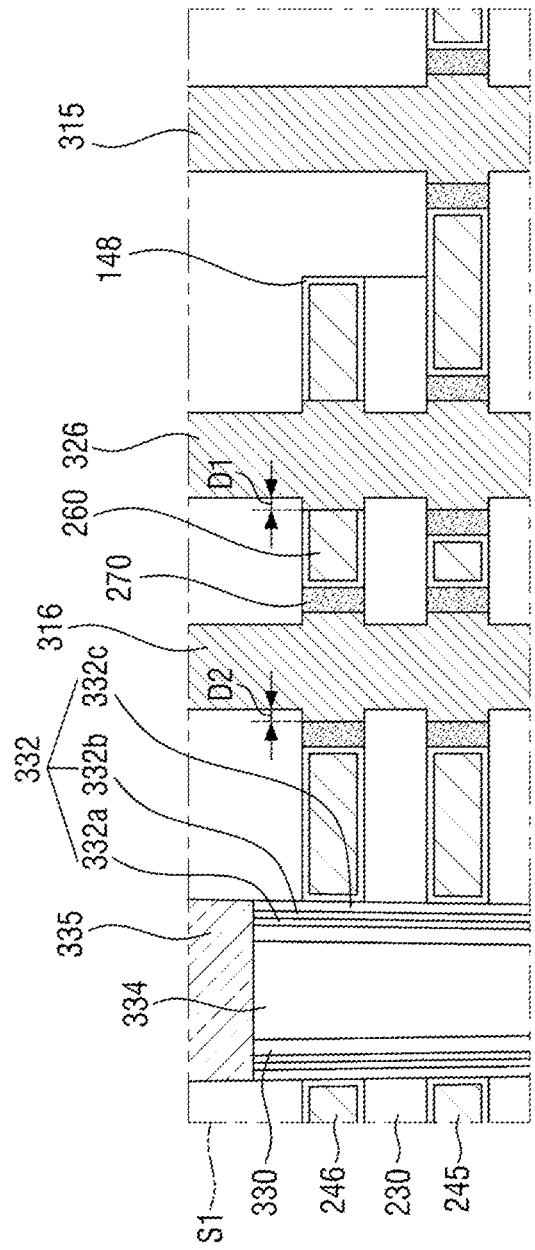
Figure 7:
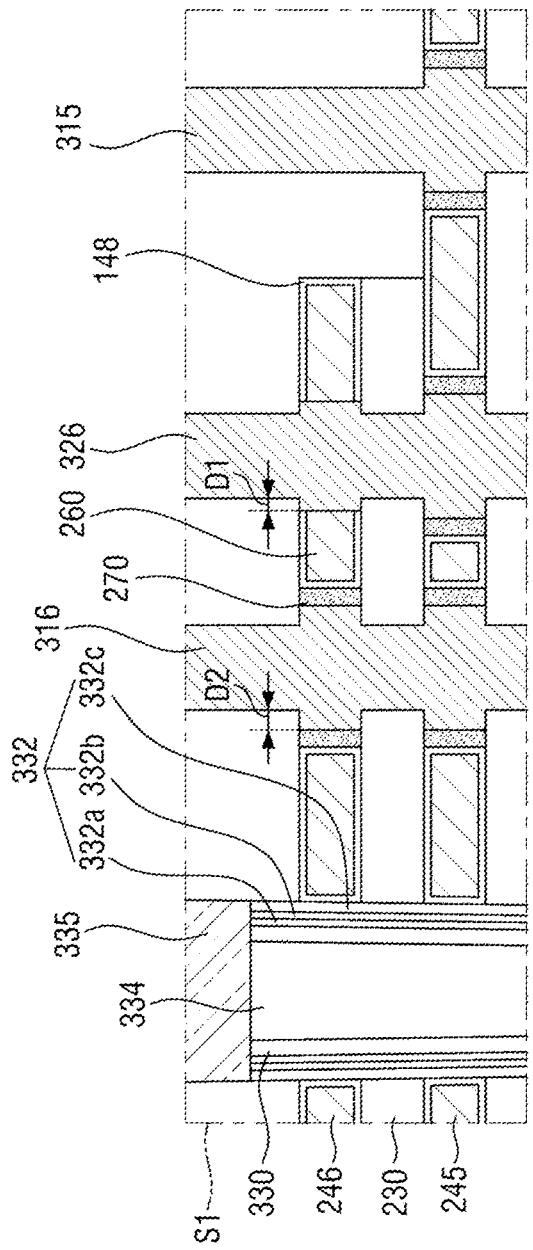

FIGS. 5, 6 and 7 are respective enlarged views of portion S1 of FIG. 4.

Referring to FIG. 5, the channel structure CH may include a channel pattern 330, an information storage layer 332, an insulating pattern 334, and a channel pad 335.

The channel pattern 330 may penetrate the first and second stacked structures ST1 and ST2. The channel pattern 330 is shown in a cup shape, but this is merely exemplary. For example, the channel pattern 330 may have various shapes such as a cylindrical shape, a rectangular tube shape, and a solid pillar shape.

The channel pattern 330 may include, for example, a semiconductor material such as silicon (Si), germanium (Ge), or a mixture thereof. Alternately, the channel pattern 330 may include a metal oxide semiconductor material.

The information storage layer 332 may be disposed between the channel pattern 330 and the first and second stacked structures ST1 and ST2. The information storage layer 332 may include multiple layers. The information storage layer 332 may include, for example, a tunnel insulating layer 332a, a charge storage layer 332b, and a blocking insulating layer 332c sequentially stacked on the channel pattern 330.

The tunnel insulating layer 332a may include, for example, silicon oxide or a high dielectric constant material (e.g., aluminum oxide ($Al_2O_3$) or hafnium oxide ($HfO_2$)) having a higher dielectric constant than silicon oxide. The charge storage layer 332b may include, for example, silicon nitride. The blocking insulating layer 332c may include, for example, silicon oxide or a high dielectric constant material (e.g., aluminum oxide ($Al_2O_3$) or hafnium oxide ($HfO_2$)) having a higher dielectric constant than silicon oxide.

The insulating pattern 334 may be formed to fill the inside of the channel pattern 330. The insulating pattern 334 may include, for example, silicon oxide.

The channel pad 335 may be disposed in the second interlayer insulating layer 250. The channel pad 335 may be disposed on the channel pattern 330. Accordingly, the channel structure CH may be electrically connected to the bit line 360 through the channel pattern 330 and the bit line contact 336.

Referring to FIG. 6, the first electrode pads 141 to 146 and the second electrode pads 241 to 246 may further include horizontal insulating patterns 148. The horizontal insulating patterns 148 may be disposed between the first electrode pads 141 to 146 and the first insulating layer 130, between the second electrode pads 241 to 246 and the second insulating layer 230, and between the first and second electrode pads 141 to 146 and 241 to 246 and the blocking insulating layer 332c.

The horizontal insulating pattern 148 may include, e.g., silicon oxide or a high dielectric constant insulating layer.

The first and second contact plugs 310 and 320 may extend toward the first and second conductive regions 160 and 260 by a first length D1 in the first and second conductive regions 160 and 260 while penetrating therethrough, respectively. The first and second contact plugs 310 and 320 may extend toward the first and second insulating regions 170 and 270 by a second length D2 in the first and second insulating regions 170 and 270 while penetrating therethrough, respectively. For example, the first length D1 and the second length D2 may be substantially the same.

Referring to FIG. 7, the first length D1 may be different from the second length D2. For example, the first length D1 may be shorter than the second length D2. Alternately, the first length D1 may be longer than the second length D2.

Figure 8:
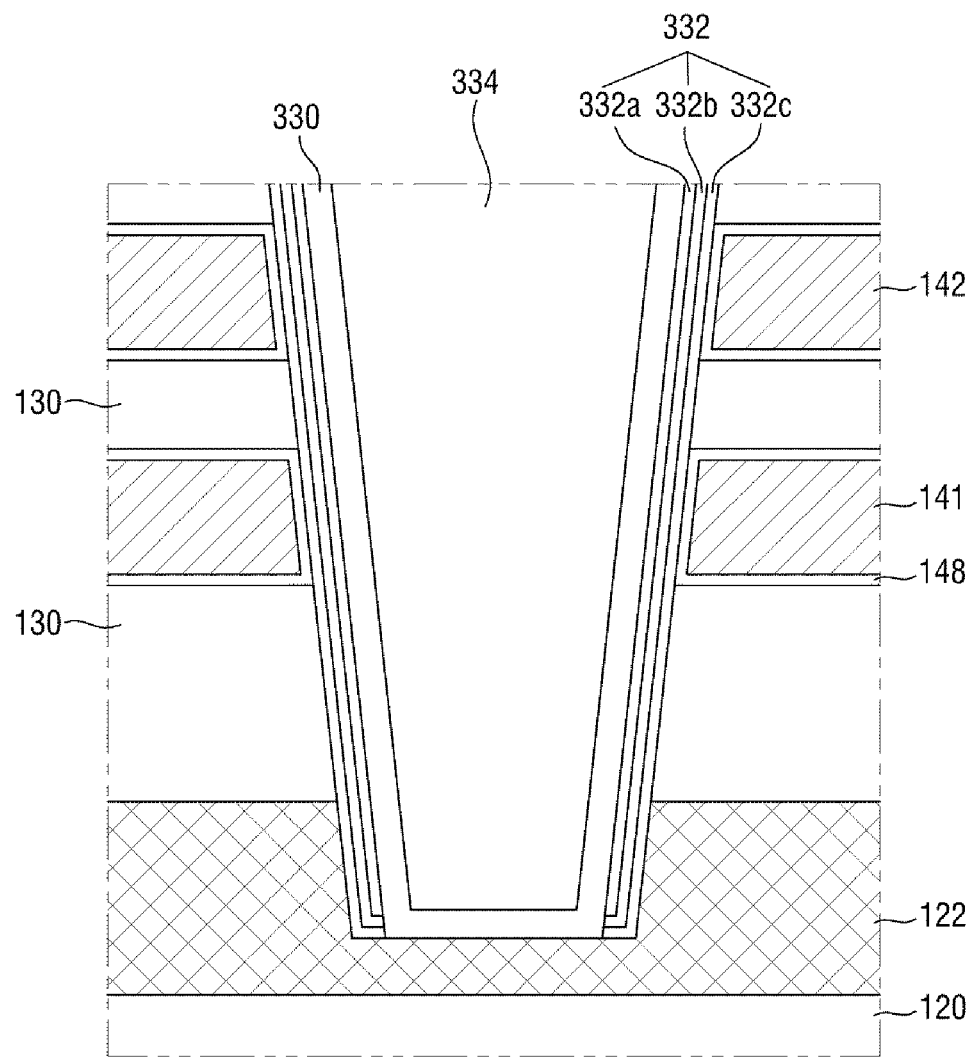
FIGS. 8 and 9 are respective enlarged views of portion S2 of FIG. 4.
Figure 9:
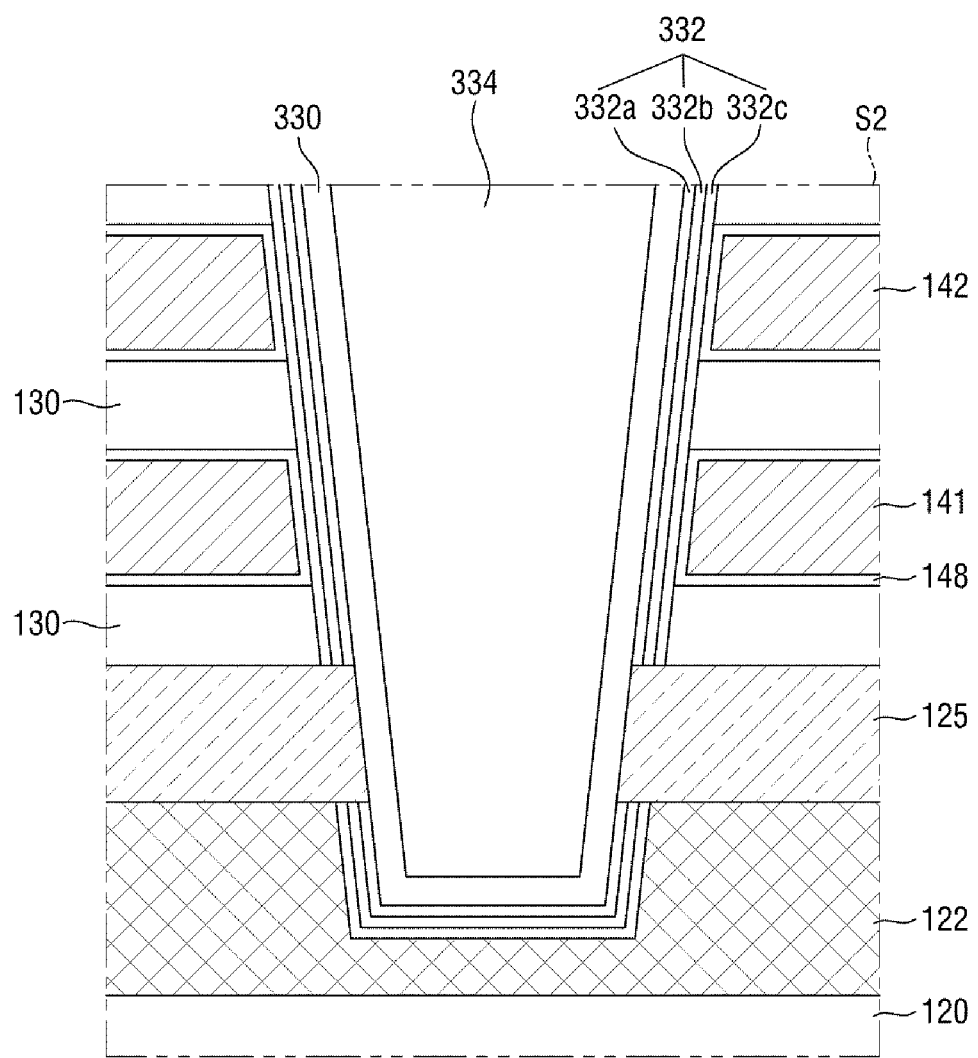

FIGS. 8 and 9 are respective enlarged views of portion S2 of FIG. 4.

Referring to FIG. 8, the stacked tunnel insulating layer 332a, charge storage layer 332b and blocking insulating layer 332c may be separated at a bottom portion of the channel pattern 330. The sidewall portion of the channel pattern 330 may not be exposed, and the bottom portion of the channel pattern 330 may be exposed. The tunnel insulating layer 332a, the charge storage layer 332b, and the blocking insulating layer 332c disposed between the bottom portion of the channel pattern 330 and the common source plate 124 may be removed. The channel pattern 330 may be electrically connected to the common source plate 124 through the bottom portion of the channel pattern 330.

Referring to FIG. 9, a supporter layer 125 may be further disposed between the common source plate 124 and the first stacked structure ST1.

The tunnel insulating layer 332a, the charge storage layer 332b, and the blocking insulating layer 332c may be separated at the bottom portion of the channel pattern 330. The tunnel insulating layer 332a, the charge storage layer 332b, and the blocking insulating layer 332c that are stacked and separated may expose part of the channel pattern 330. The supporter layer 125 may be disposed between the tunnel insulating layer 332a, the charge storage layer 332b, and the blocking insulating layer 332c that are stacked and separated. The supporter layer 125 may electrically connect the common source plate 124 to the channel pattern 330.

The supporter layer 125 may include, for example, a semiconductor material such as silicon (Si), germanium (Ge), or a mixture thereof.

Figure 10:
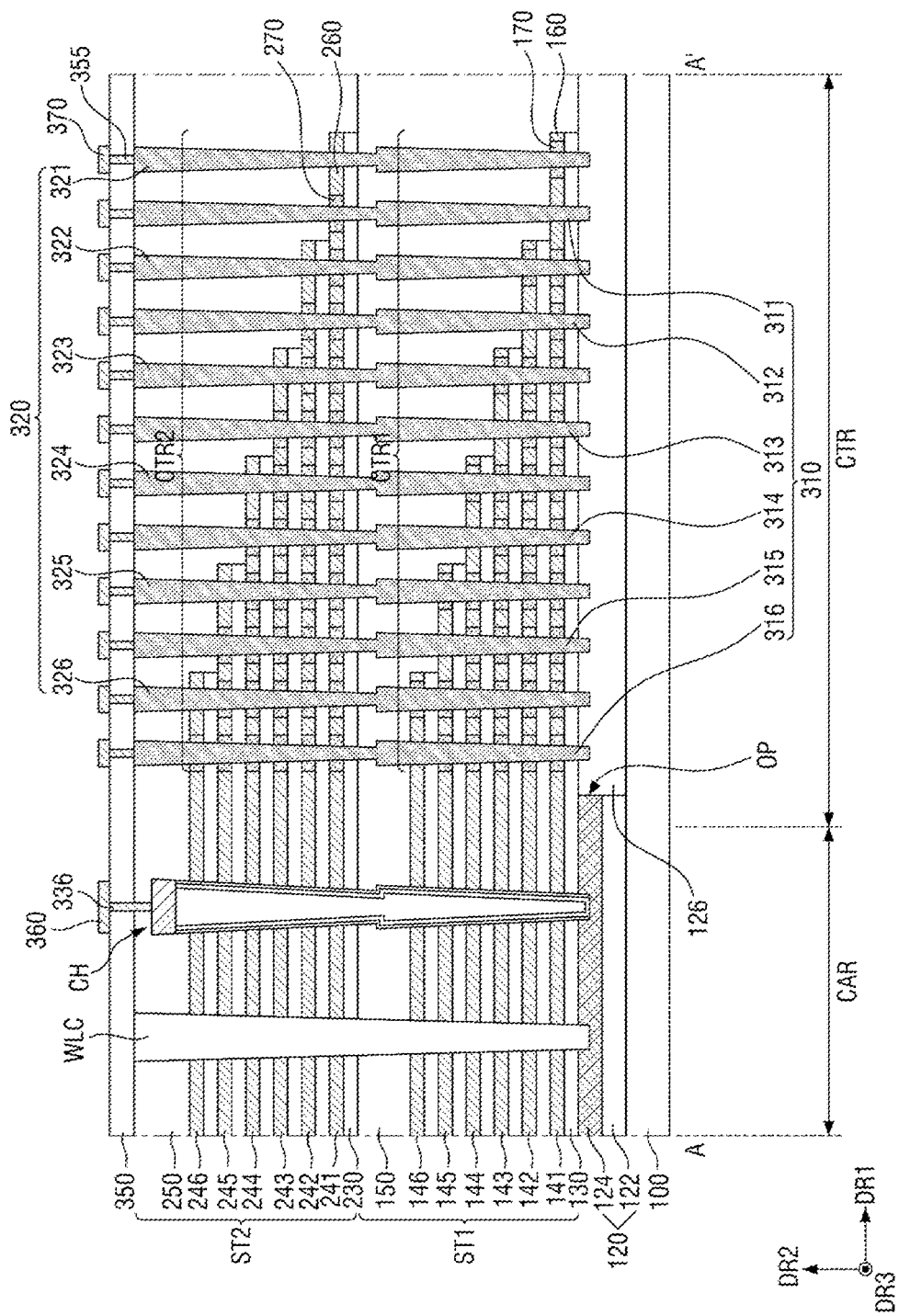
FIGS. 10, 11 and 12 are respective cross-sectional diagrams illustrating semiconductor memory devices according to various embodiments of the inventive concept.
Figure 11:
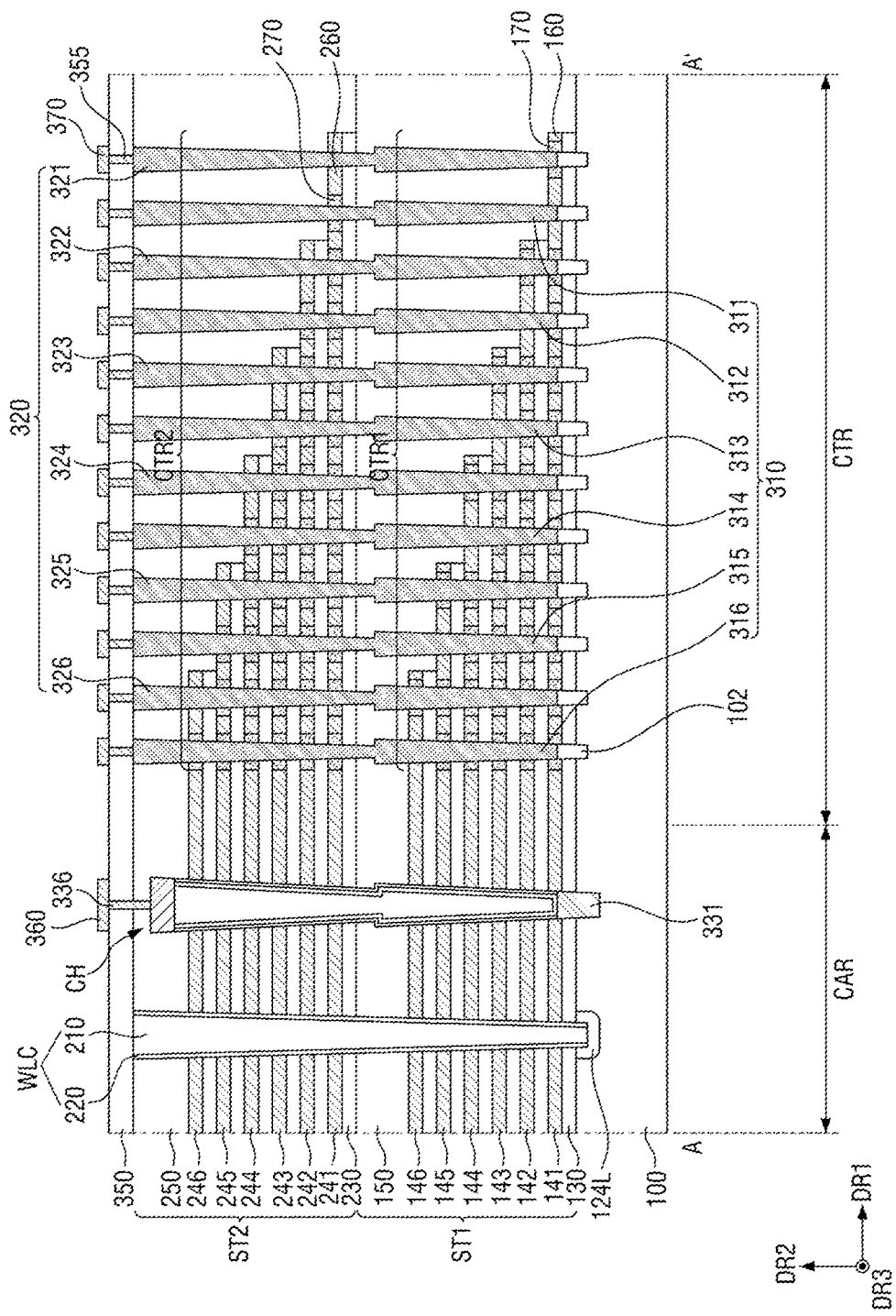

FIGS. 10 and 11 are respective cross-sectional diagrams illustrating semiconductor memory devices according to embodiments of the inventive concept. Only material differences will be emphasized in the respective descriptions of FIGS. 10 and 11, relative to the foregoing descriptions in relation to FIGS. 3 to 9.

Referring to FIG. 10, in a semiconductor memory device according to some other embodiments of the inventive concept, a horizontal semiconductor layer 120 may be disposed on a first substrate 100. The horizontal semiconductor layer 120 may include an opening OP exposing part of the first substrate 100. A filling insulating layer 126 may be formed on the first substrate 100. The filling insulating layer 126 may fill the opening OP. A first stacked structure ST1 and a second stacked structure ST2 may be disposed on the horizontal semiconductor layer 120.

Referring to FIG. 11, in a semiconductor memory device according to some other embodiments of the inventive concept, a first stacked structure ST1 may be disposed on a first substrate 100.

A cutting line WLC may include a plug pattern 210 and a spacer 220. The plug pattern 210 may be connected to the first substrate 100 while penetrating the first and second stacked structures ST1 and ST2. In some embodiments, the plug pattern 210 may be provided as the common source line CSL of the semiconductor memory device of FIG. 2. For example, the plug pattern 210 may contain a conductive material. Further, the plug pattern 210 may be connected to an impurity region 124L in the first substrate 100. The impurity region 124L may extend in the first direction DR1, for example.

A spacer 220 may be interposed between the plug pattern 210 and the first and second stacked structures ST1 and ST2. For example, the spacer 220 may extend along a side surface of the plug pattern 210. The spacer 220 may contain an insulating material. Accordingly, the plug pattern 210 may be electrically separated from the first electrode pads 141 to 146 of the first stacked structure ST1 and the second electrode pads 241 to 246 of the second stacked structure ST2.

The channel structure CH may further include an epitaxial layer 331 in direct contact with the first substrate 100. The epitaxial layer 331 may be disposed in a recessed area of the first substrate 100. The epitaxial layer 331 may be disposed at a lowermost portion of the channel pattern 330 in the second direction DR2.

The epitaxial layer 331 may be an epitaxial layer grown from the first substrate 100 using a selective epitaxial growth (SEG) process. That is, the channel pattern 330 may be electrically connected to the first substrate 100 through the epitaxial layer 331.

The first and second contact plugs 310 and 320 may be electrically insulated from the first substrate 100 by a substrate insulating layer 102 in the first substrate 100. The substrate insulating layer 102 may be disposed in a recessed area of the first substrate 100. Alternately, the substrate insulating layer 102 may be disposed on the first substrate 100.

Figure 12:
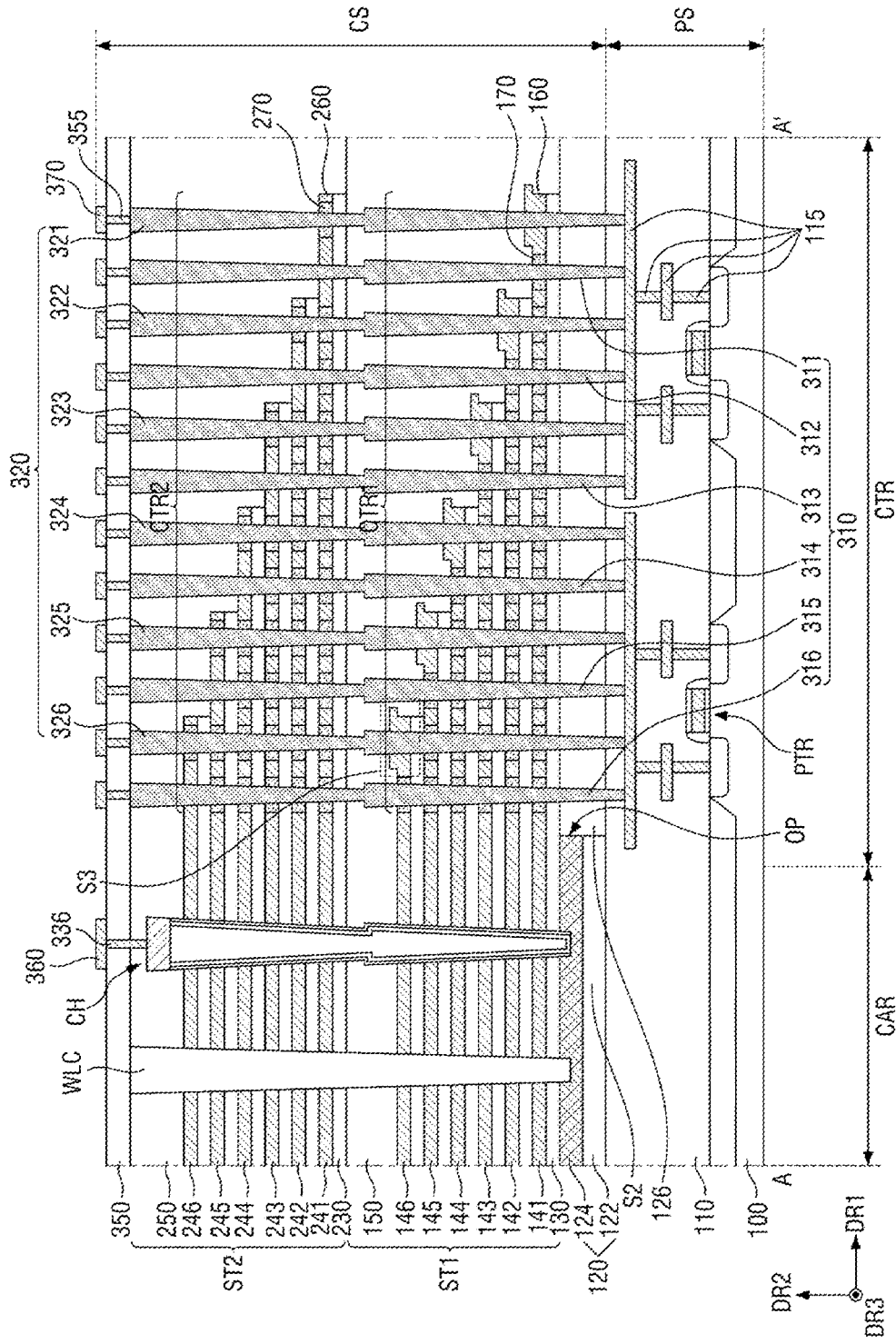
Figure 13:
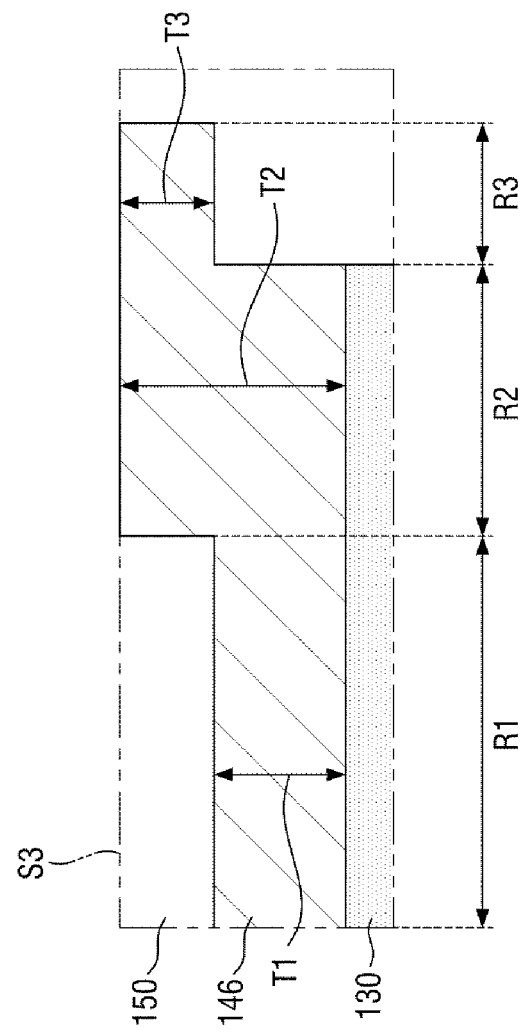
FIG. 13 is an enlarged view of portion S3 of FIG. 12.

FIG. 12 is a cross-sectional diagram illustrating a semiconductor memory device according to embodiments of the inventive concept, and FIG. 13 is an enlarged view of portion S3 of FIG. 12. Only material differences will be emphasized in the descriptions of FIGS. 12 and 13, relative to the foregoing descriptions in relation to FIGS. 3 to 9.

Referring to FIGS. 12 and 13, the first electrode pads 141 to 146 may include a first portion R1 having a first thickness T1, a second portion R2 having a second thickness T2, and a third portion R3 having a third thickness T3 in the second direction DR2. The first to third portions R1 to R3 may be sequentially arranged in the first direction DR1. The second portion R2 may be disposed between the first portion R1 and the third portion R3 and connected to the first portion R1 and the third portion R3.

A bottom surface of the first portion R1 may be disposed on the same plane as a bottom portion of the second portion R2, and the second thickness T2 may be greater than the first thickness T1. A top surface of the second portion R2 may be disposed above a top surface of the first portion R1.

A top surface of the third portion R3 may be disposed on the same plane as the top surface of the second portion R2, and the third thickness T3 may be less than the first thickness T1. A bottom surface of the second portion R2 may be disposed below a bottom portion of the third portion R3. The third portion R3 may be a portion protruding in the first direction DR1.

The first conductive region 160 may be disposed at the second portion R2 and the third portion R3. The first contact plug 310 may penetrate the second portion R2. The second contact plug 320 may penetrate the first portion R1.

Figure 14:
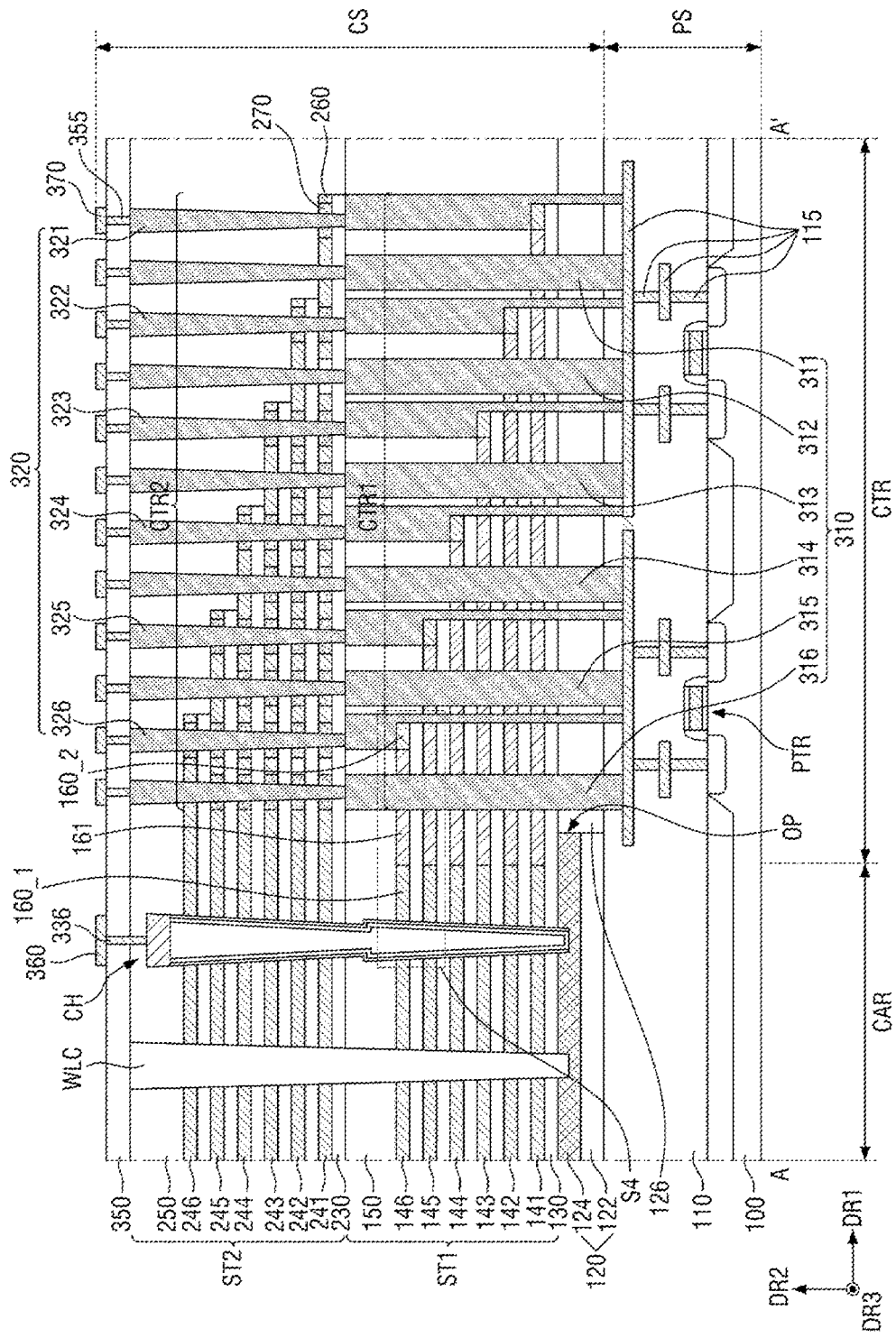
FIG. 14 is a cross-sectional diagram illustrating a semiconductor memory device according to embodiments of the inventive concept.
Figure 15:
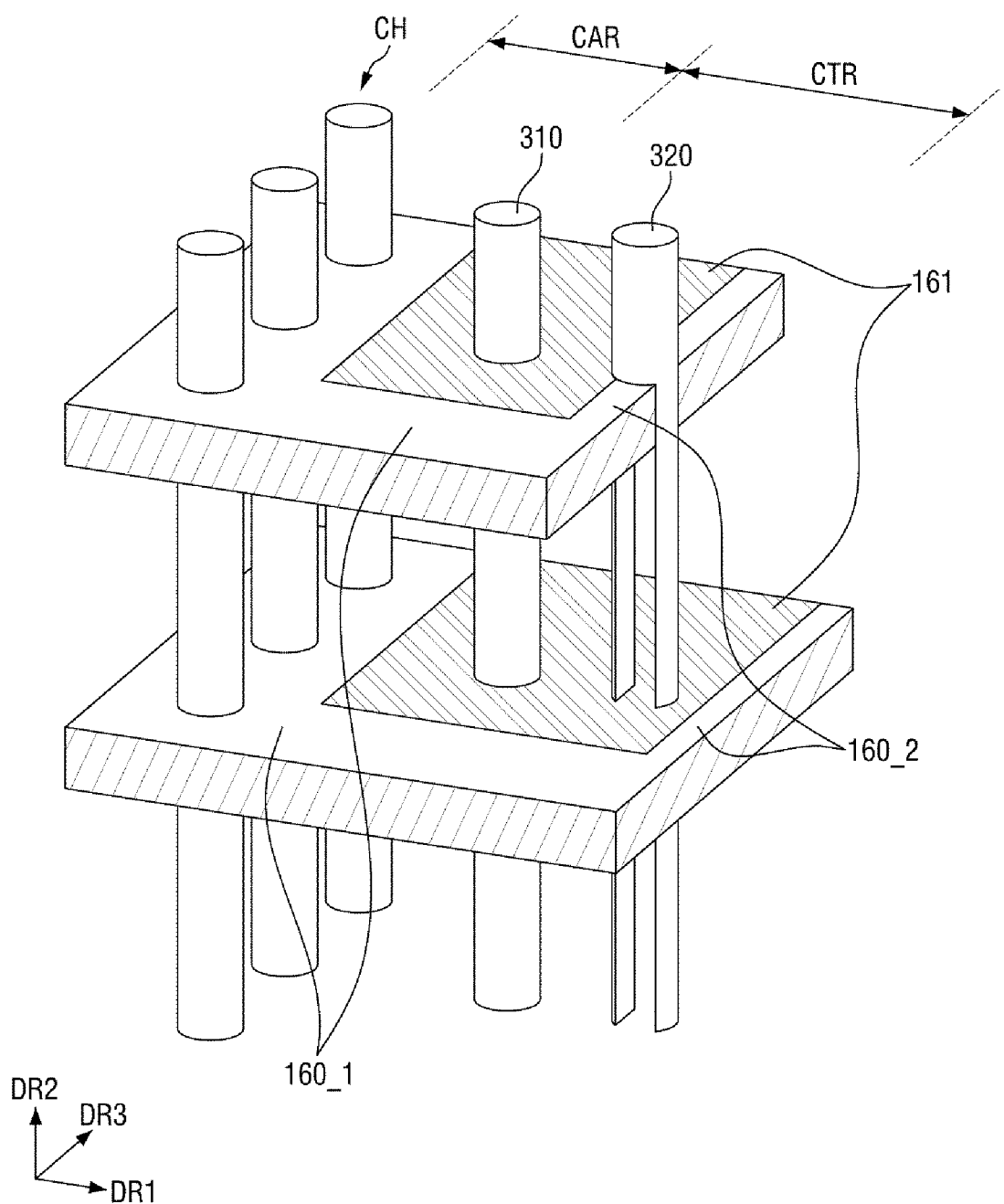
FIG. 15 is an enlarged perspective view of portion S4 of FIG. 14.

FIG. 14 is a cross-sectional diagram illustrating a semiconductor memory device according to embodiments of the inventive concept, and FIG. 15 is an enlarged perspective view of portion S4 of FIG. 14. Only material differences will be emphasized in the respective descriptions of FIGS. 14 and 15, relative to the foregoing descriptions in relation to FIGS. 3 to 9.

Referring to FIG. 14, each of the first electrode pads 141 to 146 may include a first sub-conductive region 160_1, a second sub-conductive region 160_2 and a dielectric region 161.

The first sub-conductive regions 160_1 may be disposed on the cell region CAR. The second sub-conductive regions 160_2 may be disposed at end portions of the first electrode pads 141 to 146 on the cell contact region CTR. The dielectric regions 161 may be disposed on the cell contact region CTR. The dielectric regions 161 may be disposed between the first sub-conductive regions 160_1 and the second sub-conductive regions 160_2. The dielectric regions 161 may be at least partially surrounded by the first and second sub-conductive regions 160_1 and 160_2.

The first contact plug 310 may surround top surfaces and side surfaces of the second sub-conductive regions 160_2 while penetrating the first stacked structure ST1. Accordingly, the first contact plug 310 may be electrically connected to the uppermost first electrode pad among the first electrode pads 141 to 146 while penetrating therethrough, and may be electrically insulated from the first electrode pads disposed below the uppermost first electrode pad.

The second sub-conductive regions 160_2 may not overlap each other in the second direction DR2. The second sub-conductive regions 160_2 may overlap the dielectric regions 161 included in the other first electrode pads 141 to 146 in the second direction DR2.

The first contact plug 310 surrounding the side surfaces of the second sub-conductive regions 160_2 may extend in the second direction DR2. The first contact plug 310 may penetrate the dielectric region 161 disposed below the uppermost first electrode pad. Accordingly, the first contact plug 310 may be electrically insulated from the first electrode pads disposed below the uppermost first electrode pad.

The first contact plug 310 may have an L shape as shown in FIG. 14.

Alternately, referring to FIG. 15, the first contact plug 310 may surround both side surfaces of the second sub-conductive region 160_2. The first contact plug 310 may extend in the second direction DR2 at one surface where the second sub-conductive region 160_2 and the dielectric region 161 are in contact with each other, and at least partially penetrate the first electrode pads 141 to 146.

The second contact plug 320 may penetrate the dielectric region 161. The dielectric region 161 may surround the second contact plug 320. Accordingly, the second contact plug 320 may be insulated from the first electrode pads 141 to 146.

The dielectric region 161, which is a remaining portion of a first sacrificial layer used during the manufacturing process and as described hereafter, may contain nitride or the like. (See, e.g., element 140 in FIG. 18).

The widths of the first and second contact plugs 310 and 320 in the first direction DR1 may be increased from, e.g., the first substrate 100 to a surface where the first stacked structure ST1 and the second stacked structure ST2 are in contact with each other, and decreased at the surface where the first stacked structure ST1 and the second stacked structure ST2 are in contact with each other. The widths of the first and second contact plugs 310 and 320 in the first direction DR1 may be increased in the second direction DR2 from the surface where the first stacked structure ST1 and the second stacked structure ST2 are in contact with each other.

Figure 16:
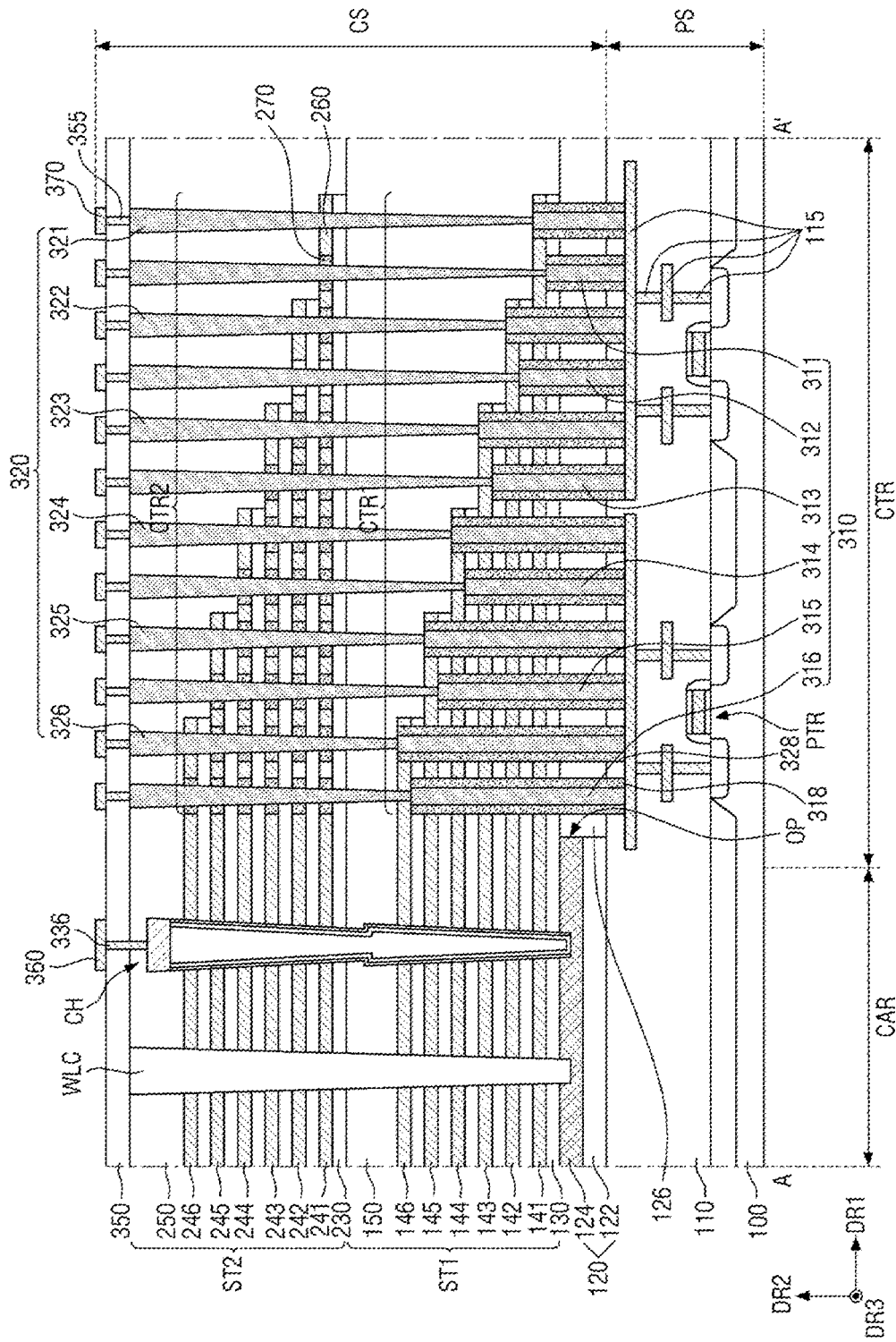
FIGS. 16 and 17 are respective cross-sectional diagrams illustrating a semiconductor memory device according to embodiments of the inventive concept.

FIG. 16 is a cross-sectional diagram illustrating a semiconductor memory device according to embodiments of the inventive concept. Only material differences will be emphasized in the description of FIG. 16, relative to the foregoing descriptions in relation to FIGS. 3 to 9.

Referring to FIG. 16, the first and second contact plugs 310 and 320 may further include first and second insulating spacers 318 and 328, respectively.

The first insulating spacer 318 may be disposed between the first contact plug 310 and the first electrode pads 141 to 146. The first insulating spacer 318 may extend in the second direction DR2 along a sidewall of the first contact plug 310. The first insulating spacer 318 may extend to a bottom surface of the uppermost first electrode pad among the first electrode pads 141 to 146 through which the first contact plug 310 penetrates. A top surface of the first insulating spacer 318 may be disposed on the same plane as the bottom surface of the uppermost first electrode pad 146 among the first electrode pads 141 to 146 through which the first contact plug 310 penetrates. Accordingly, the first contact plug 310 may be insulated from the first electrode pads disposed below the uppermost first electrode pad 146 among the first electrode pads 141 to 146 while penetrating therethrough.

The first contact plug 310 may be surrounded by the uppermost first electrode pad among the first electrode pads 141 to 146 while penetrating therethrough. Accordingly, the first contact plug 310 may be electrically connected to the uppermost first electrode pad among the first electrode pads 141 to 146 while penetrating therethrough.

The second insulating spacer 328 may be disposed between the second contact plug 320 and the first electrode pads 141 to 146. The second insulating spacer 328 may extend in the second direction DR2 along a sidewall of the second contact plug 320. A top surface of the second insulating spacer 328 may be disposed on the same plane as a top surface of the uppermost first electrode pad among the first electrode pads 141 to 146 through which the second contact plug 320 penetrates. Accordingly, the second contact plug 320 may be insulated from the first electrode pads 141 to 146.

The widths of the first and second contact plugs 310 and 320 respectively disposed in the first and second insulating spacers 318 and 328 in the first direction DR1 may be increased from, e.g., the first substrate 100 in the second direction DR2 and decreased at the top surfaces of the first and second insulating spacers 318 and 328, respectively. The widths of the first and second contact plugs 310 and 320 in the first direction DR1 may be increased from the top surfaces of the first and second insulating spacers 318 and 328 in the second direction DR2, respectively.

Figure 17:
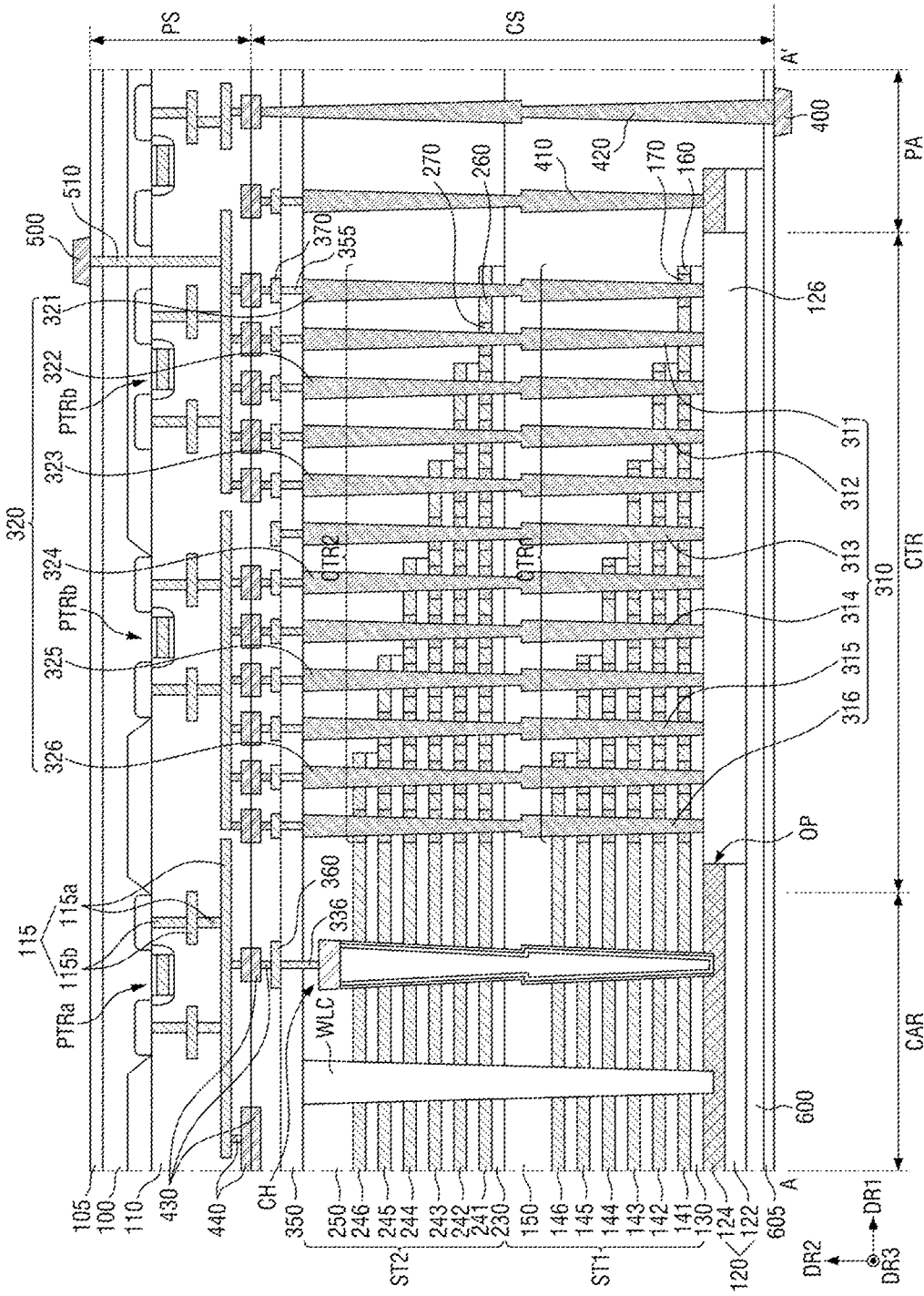

FIG. 17 is a cross-sectional diagram illustrating a semiconductor memory device according to embodiments of the inventive concept. Only material differences will be emphasized in the description of FIG. 17, relative to the foregoing descriptions in relation to FIGS. 3 to 9.

Referring to FIG. 17, the semiconductor memory device is assumed to have a chip to chip (C2C) structure. Here, the term "chip to chip (C2C) structure" denotes a structure obtained by manufacturing an upper chip including a cell array structure CS on a first wafer, manufacturing a lower chip including a peripheral circuit structure PS on a second wafer different from the first wafer, and thereafter connecting the upper chip and the lower chip using a bonding method. Here, the bonding method may include a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

Each of the peripheral circuit structure PS and the cell array structure CS of the semiconductor memory device may include a cell region CAR, a cell contact region CTR and an external pad bonding region PA.

The peripheral circuit structure PS may include a first substrate 100, a peripheral logic insulating layer 110, peripheral circuits PTRa and PTRb formed in the first substrate 100, and a first wiring connector 115 connected to each of the peripherals circuits PTRa and PTRb, and a first bonding metal 440 formed on the first wiring connector 115.

The peripheral circuits PTRa and PTRb may be included in the page buffer 35 of FIG. 1 and the row decoder 33 of FIG. 1. For example, the peripheral circuit PTRa of the cell region CAR may provide the row decoder, and the peripheral circuit PTRb of the cell contact region CTR may provide the page buffer. In one example, an operating voltage of the peripheral circuit PTRb providing the page buffer may be higher than that of the peripheral circuit PTRa providing the row decoder.

A first bonding metal 440 having the same shape as that of a second bonding metal 430 may be formed at the peripheral circuit structure PS to correspond to the second bonding metal 430 included in the cell array structure CS.

The first bonding metal 440 formed at the lowermost portion of the peripheral circuit structure PS in the external pad bonding region PA may not be connected to another first wiring connector 115. The first bonding metal 440 formed at the lowermost portion of the peripheral circuit structure PS in the cell region CAR may be electrically connected to the second bonding metal 430 formed at the uppermost portion of the cell array structure CS by a bonding method. The first bonding metal 440 formed at the lowermost portion of the peripheral circuit structure PS in the cell contact region CTR may not be connected to another bit line contact 336.

In some embodiments, a first wiring connector 115a may be formed of tungsten having relatively high resistance, and a first wiring connector 115b may be formed of copper having relatively low resistance. However, the inventive concept is not limited thereto, and one or more wiring connectors may be further formed on the first wiring connector 115. At least part of one or more wiring connectors formed on the first wiring connector 115 may be formed of aluminum or the like having lower resistance than that of copper forming the first wiring connector 115b.

In the external pad bonding region PA, a common source line contact plug 410, lower and upper input/output (I/O) pads 400 and 500, and an upper I/O contact plug 510 may be arranged. The common source line contact plug 410 may be formed of a conductive material such as a metal, a metal compound, or a conductive material such as polysilicon or the like, and may be electrically connected to the common source plate 124.

The lower and upper I/O pads 400 and 500 may be disposed in the external pad bonding region PA. The upper I/O pad 500 may be formed on an upper insulating layer 105 formed on a top surface of the first substrate 100. The upper I/O pad 500 may be connected to at least one of the peripheral circuits PTRa and PTRb of the peripheral circuit structure PS via the upper I/O contact plug 510, and may be separated from the first substrate 100 by the upper insulating layer 105. Further, a side insulating layer may be disposed between the upper I/O contact plug 510 and the first substrate 100 to electrically insulate the upper I/O contact plug 510 from the first substrate 100.

The cell array structure CS may provide at least one memory block. The cell array structure CS may include a second substrate 600, a horizontal semiconductor layer 120 on the second substrate 600, and first and second stacked structures ST1 and ST2 sequentially stacked on the horizontal semiconductor layer 120. The first and second stacked structures ST1 and ST2 may be one of the first and second stacked structures ST1 and ST2 described with reference to FIGS. 4 to 16.

In the cell region CAR, the bit line 360 on the first and second stacked structures ST1 and ST2 may be connected to the second bonding metal 430, and the second bonding metal 430 may be connected to the first bonding metal 440 connected to the peripheral circuit PTRb of the page buffer.

In the cell contact region CTR, the second bonding metal 430 may be disposed on the first and second contact plugs 310 and 320, and the first and second contact plugs 310 and 320 may be connected to the peripheral circuit structure PS via the first and second bonding metals 430 and 440.

A lower insulating layer 605 may be formed below the second substrate 600, and the lower I/O pad 400 may be disposed on a bottom surface of the lower insulating layer 605. The lower I/O pad 400 may be connected to at least one of the peripheral circuits PTRa and PTRb of the peripheral circuit structure PS via the lower I/O contact plug 420.

Depending on the nature of various embodiments, the second substrate 600, the horizontal semiconductor layer 120, and the like may not be arranged in the region where the lower I/O contact plug 420 is disposed. The lower I/O contact plug 420 may be connected to the lower I/O pad 400 while penetrating through the first and second interlayer insulating layer 150 and 250 and the lower insulating layer 605.

Thus, depending on the nature of various embodiments, the upper I/O pad 500 and the lower I/O pad 400 may be selectively formed. For example, the semiconductor memory device may include only the upper I/O pad 500 disposed above the first substrate 100, or include only the lower I/O pad 400 disposed below the second substrate 600, or may include both the upper I/O pad 500 and the lower I/O pad 400.

FIGS. 18 to 26 are related cross-sectional diagrams taken along line A-A' of FIG. 3 and illustrating in one example a method of manufacturing a semiconductor memory device according to embodiments of the inventive concept.

Figure 18:
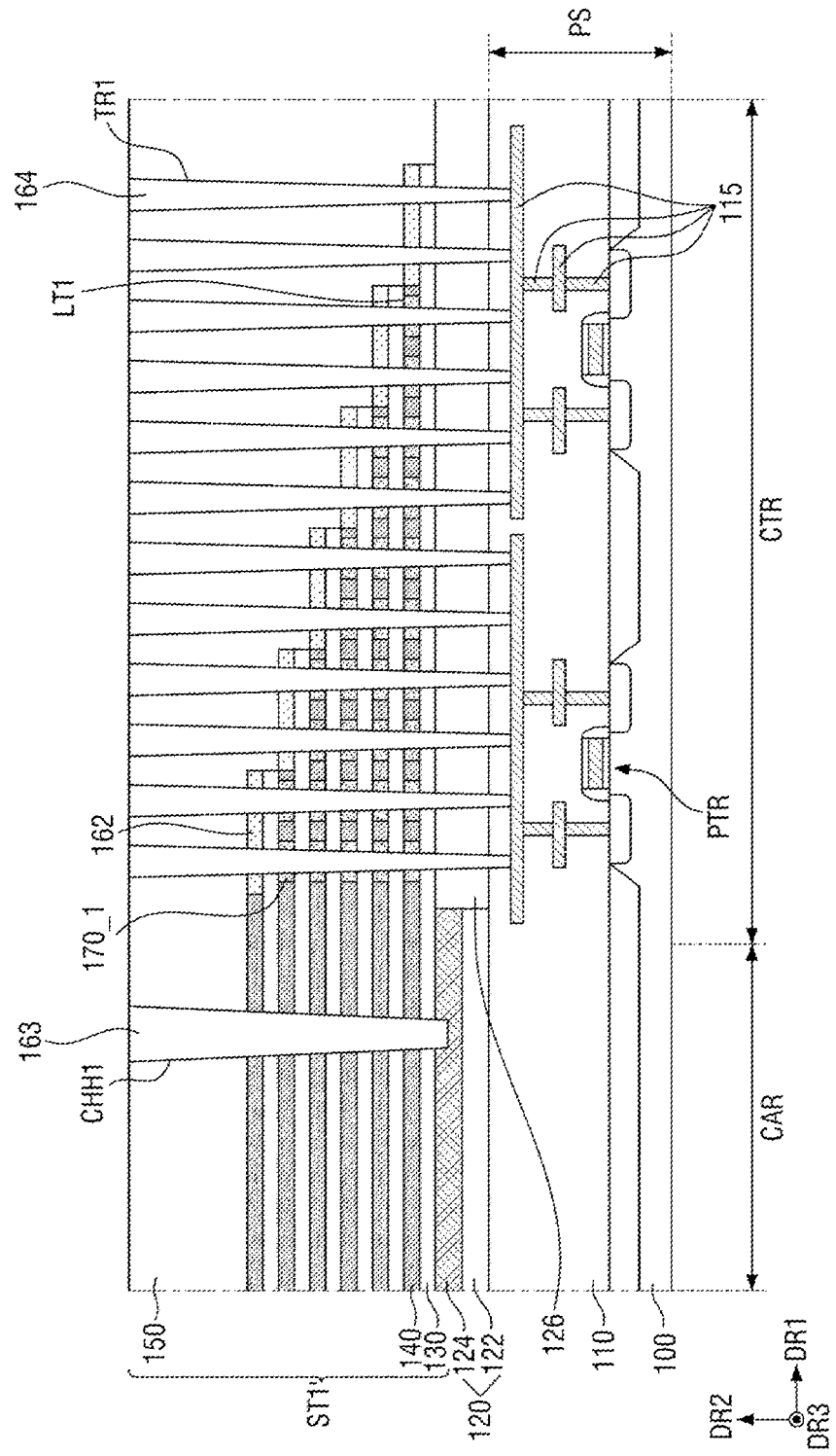
FIGS. 18, 19, 20, 21, 22, 23, 24, 25 and 26 ("FIGS. 18 to 26") are related cross-sectional diagrams illustrating in one example a method of manufacturing a semiconductor memory device according to embodiments of the inventive concept.

Referring to FIG. 18, a horizontal semiconductor layer 120 may be formed on the peripheral circuit structure PS. A filling insulating layer 126 may be formed on an opening OP of the horizontal semiconductor layer 120. A first free stacked structure ST1' including a first insulating layer 130 and a first sacrificial layer 140 that are sequentially stacked and a first interlayer insulating layer 150 may be formed on the horizontal semiconductor layer 120.

A first impurity region 162 may be formed in the first sacrificial layer 140. The first impurity regions 162 may be formed by implanting impurities into regions of the first sacrificial layers 140 exposed by the steps of the first staircase portion CTR1, for example. The impurities may be implanted by an ion implantation process. Accordingly, the first impurity region 162 may be formed at an end portion of the first sacrificial layer 140. That is, the first impurity region 162 may be formed in the first sacrificial layer 140 exposed on the top.

The impurities may be substances having etching selectivity with respect to the first sacrificial layer 140 in the case of using a specific etching agent or under a specific etching condition. For example, the impurities may be at least one of hydrogen (H), nitrogen (N), carbon (C), or boron (B). In another example, the first impurity region 162 may be formed simply due to changes in physical properties of the first sacrificial layer 140.

Then, a first channel hole CHH1 may be formed on the cell region CAR. The first channel hole CHH1 may penetrate the first free stacked structure ST1'. A channel sacrificial pattern 163 may be formed in the first channel hole CHH1.

Then, a first trench TR1 exposing a top surface of the first wiring connector 115 may be formed on the cell contact region CTR. The first trench TR1 may penetrate the first impurity region 162. Two first trenches TR1 may be formed in the first impurity region 162 included in one first sacrificial layer 140.

Then, part of the first sacrificial layer 140 exposed by the first trench TR1 may be removed. The first sacrificial layer 140 may be selectively removed with respect to the first insulating layer 130, the first interlayer insulating layer 150, and the first impurity region 162. Accordingly, a first tunnel portion LT1 extending from the first trench TR1 in the first direction DR1 may be formed. The first tunnel portion LT1 may extend with substantially the same length from both sidewalls of the first trench TR1.

Then, a first sub-insulating region 170_1 may be formed in the first tunnel portion LT1. The first sub-insulating region 170_1 may fill the first tunnel portion LT1. A first sacrificial pattern 164 may be formed in the first trench TR1. The first sacrificial pattern 164 may fill the first trench TR1.

Figure 19:
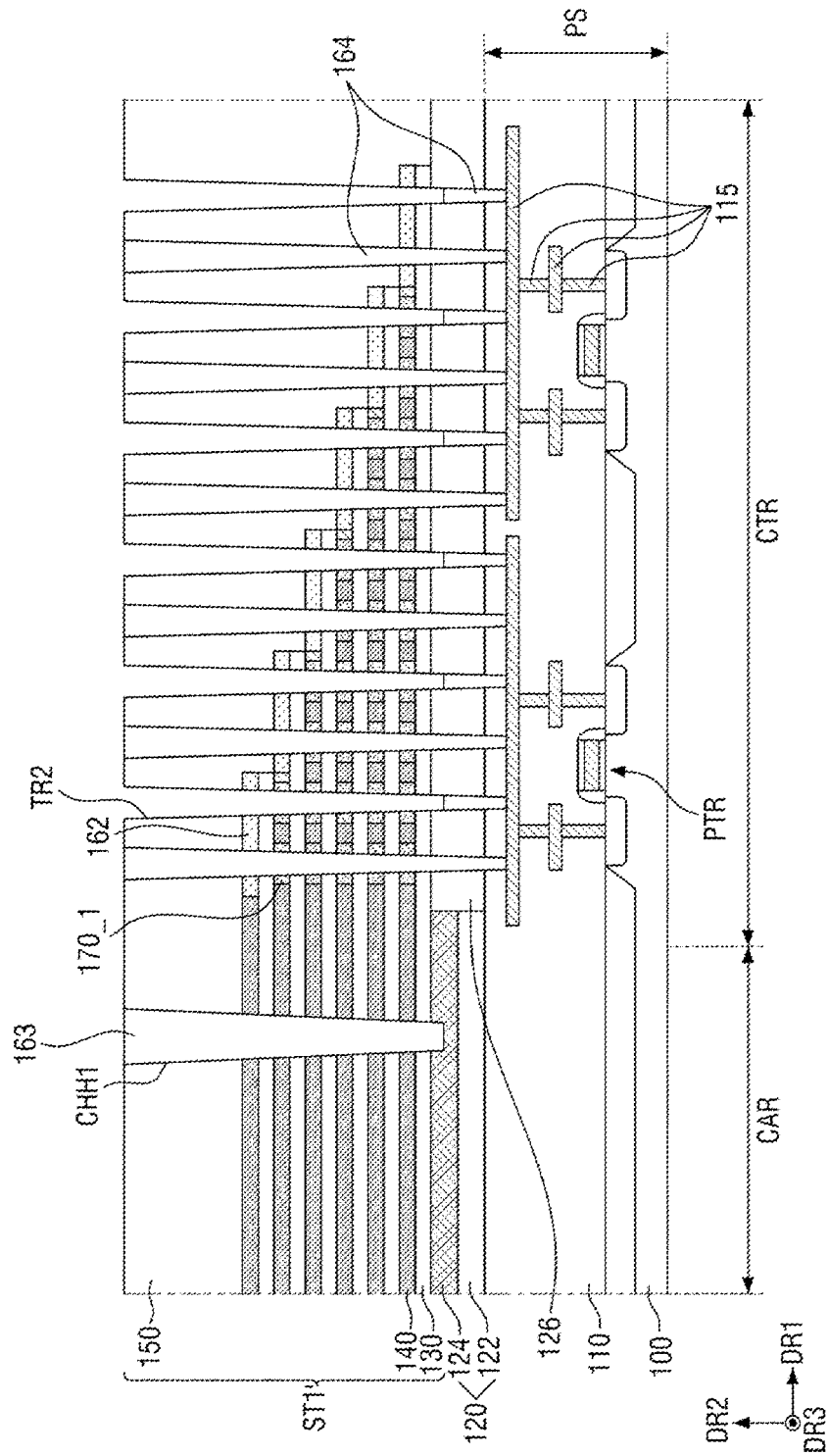

Referring to FIG. 19, a second trench TR2 may be formed on the first sacrificial pattern 164 in the first trench TR1. The second trench TR2 may be formed on the first sacrificial pattern 164 disposed in one of the first trenches TR1 penetrating through the first impurity region 162. The second trench TR2 may be formed on the first sacrificial pattern 164 in the first trench TR1 disposed at the outermost portion of the first sacrificial layer 140, for example.

Figure 20:
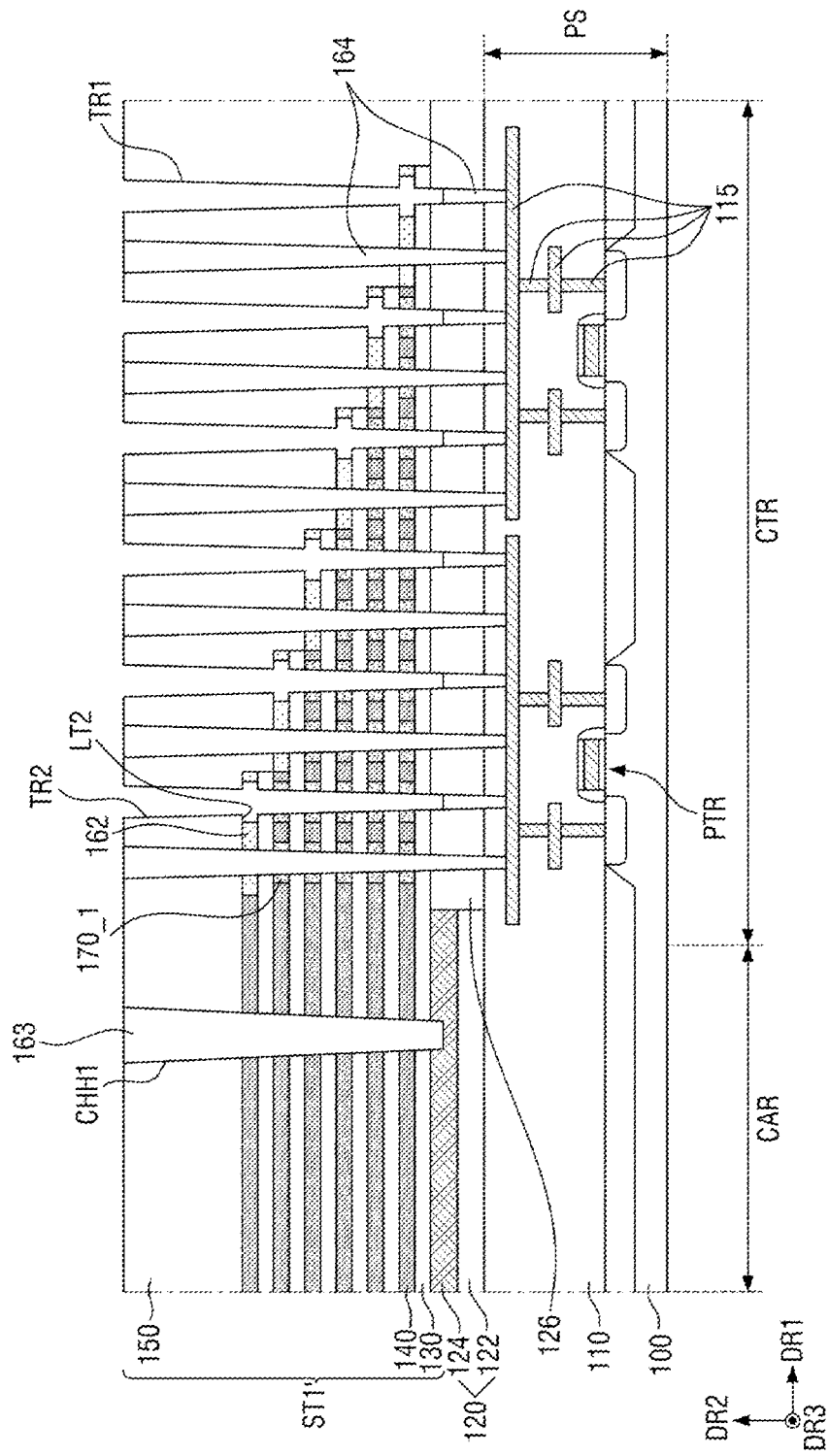

Referring to FIG. 20, part of the first impurity region 162 exposed by the second trench TR2 may be removed. The first impurity region 162 may be selectively removed with respect to the first interlayer insulating layer 150, the first insulating layer 130, and the first sacrificial layer 140. Accordingly, a second tunnel portion LT2 extending from the second trench TR2 in the first direction DR1 may be formed. The second tunnel portion LT2 may extend with substantially the same length from both sidewalls of the second trench TR2.

Figure 21:
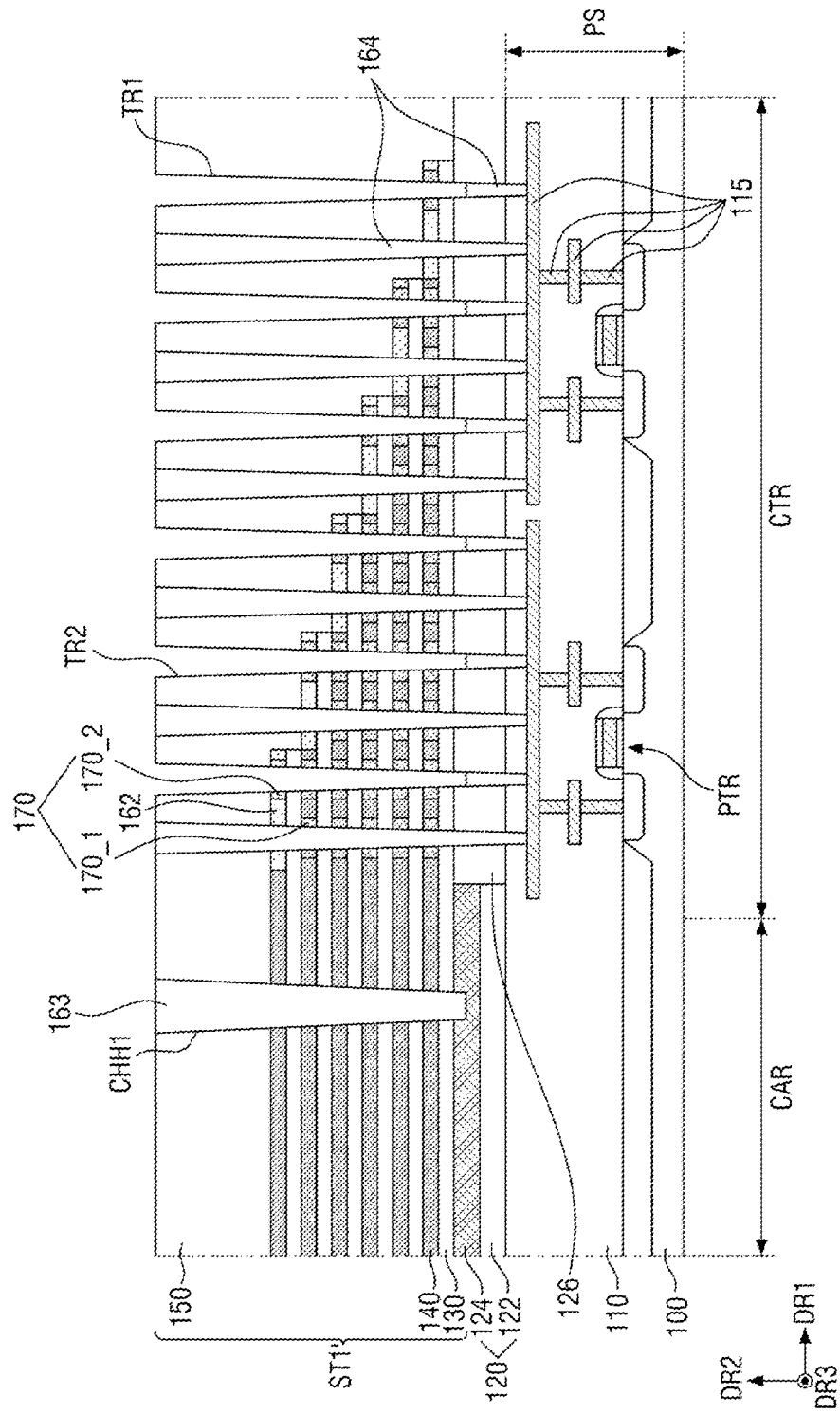

Referring to FIG. 21, a second sub-insulating region 170_2 may be formed in the second tunnel portion LT2. The second sub-insulating region 170_2 may fill the second tunnel portion LT2. Accordingly, a first insulating region 170 may be formed.

Figure 22:
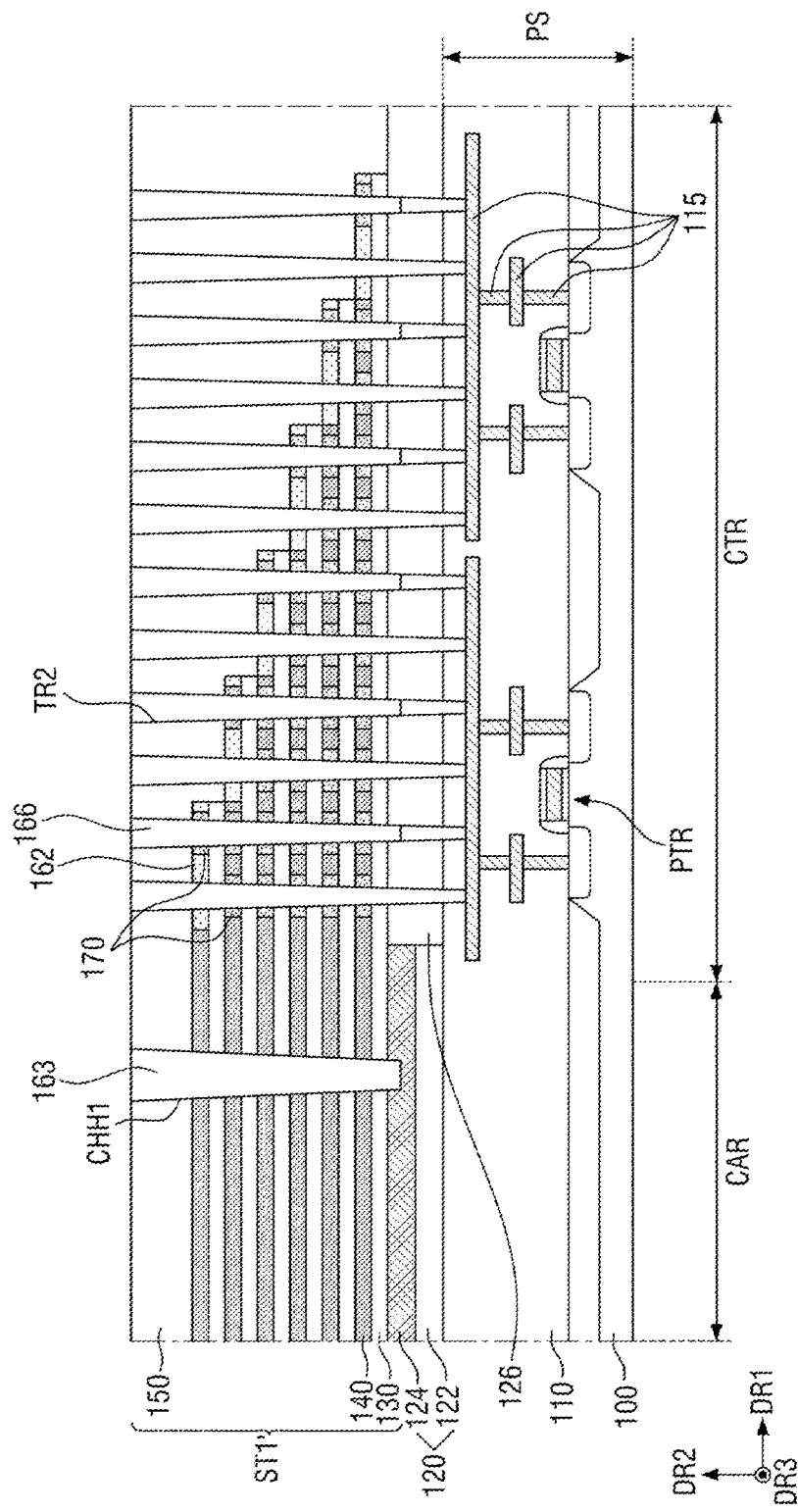

Referring to FIG. 22, a second sacrificial pattern 166 may be formed in the second trench TR2. The second sacrificial pattern 166 may fill the second trench TR2.

Then, a planarization process is performed such that top surfaces of the first interlayer insulating layer 150, the channel sacrificial pattern 163, and the first and second sacrificial patterns 164 and 166 are made coplanar.

Figure 23:
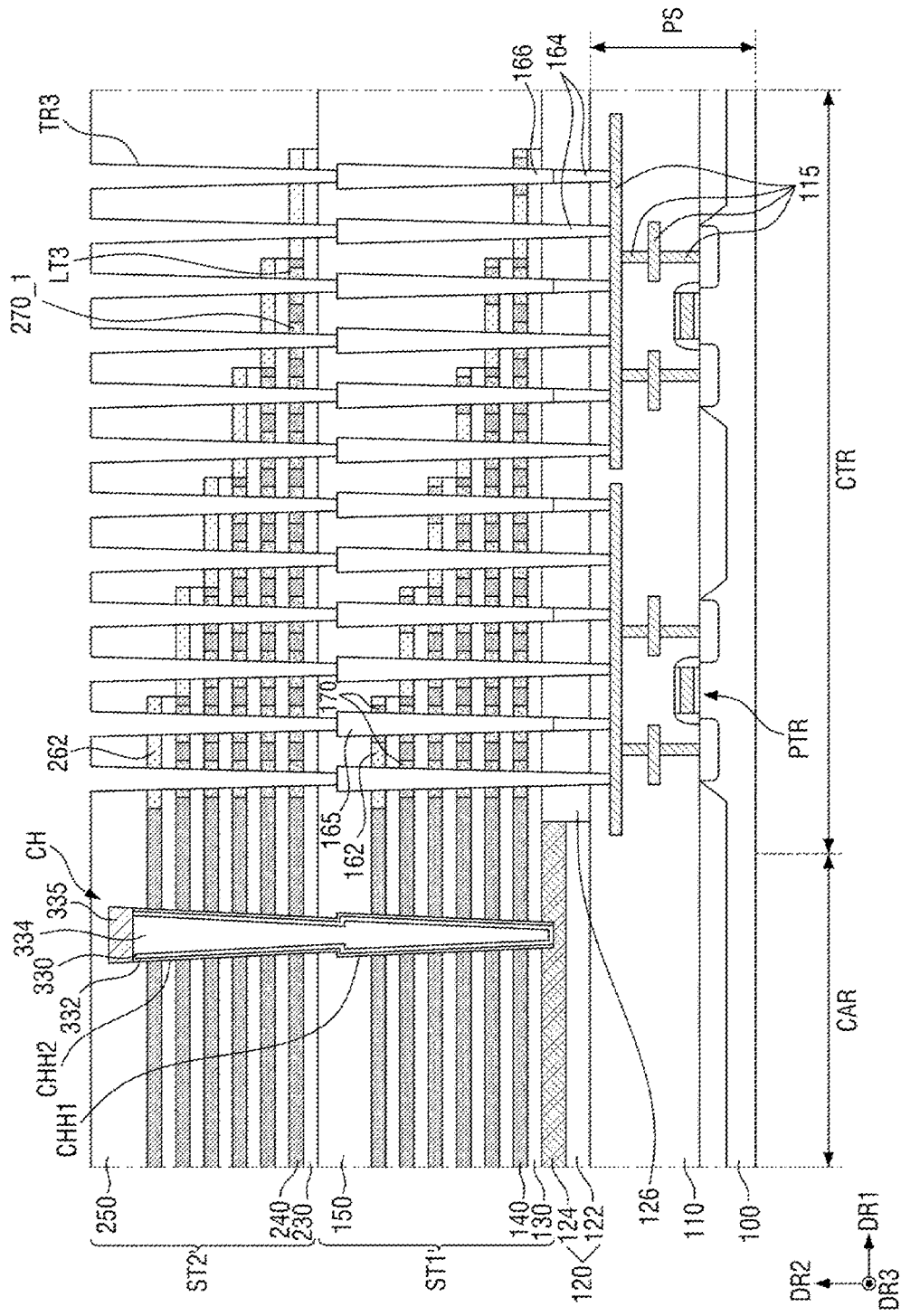

Referring to FIG. 23, a second free stacked structure ST2' may be formed on the first free stacked structure ST1'. The second free stacked structure ST2' may include a second insulating layer 230, a second sacrificial layer 240, and a second interlayer insulating layer 250 that are sequentially stacked.

Then, a second channel hole CHH2 may be formed on the channel sacrificial pattern 163. The channel sacrificial pattern 163 may be removed through the second channel hole CHH2. Then, an information storage layer 332, a channel pattern 330, an insulating pattern 334, and a channel pad 335 may be formed in the first and second channel holes CHH1 and CHH2. Accordingly, a channel structure CH may be formed.

Then, a second impurity region 262 may be formed in the second sacrificial layer 240. The second impurity region 262 may be formed by the same method as that for the first impurity region 162 described above with reference to FIG. 18.

Then, a third trench TR3 may be formed on each of the first and second sacrificial patterns 164 and 166. The third trench TR3 may penetrate the second free stacked structure ST2'.

Then, part of the second sacrificial layer 240 exposed by the third trench TR3 may be removed to form a third tunnel portion LT3. A third sub-insulating region 270_1 may be formed in the third tunnel portion LT3. The third sub-insulating region 270_1 may fill the third tunnel portion LT3. The third tunnel portion LT3 and the third sub-insulating region 270_1 may be formed by the same method as that for the first tunnel portion LT1 and the first sub-insulating region 170_1 described above with reference to FIG. 18.

Figure 24:
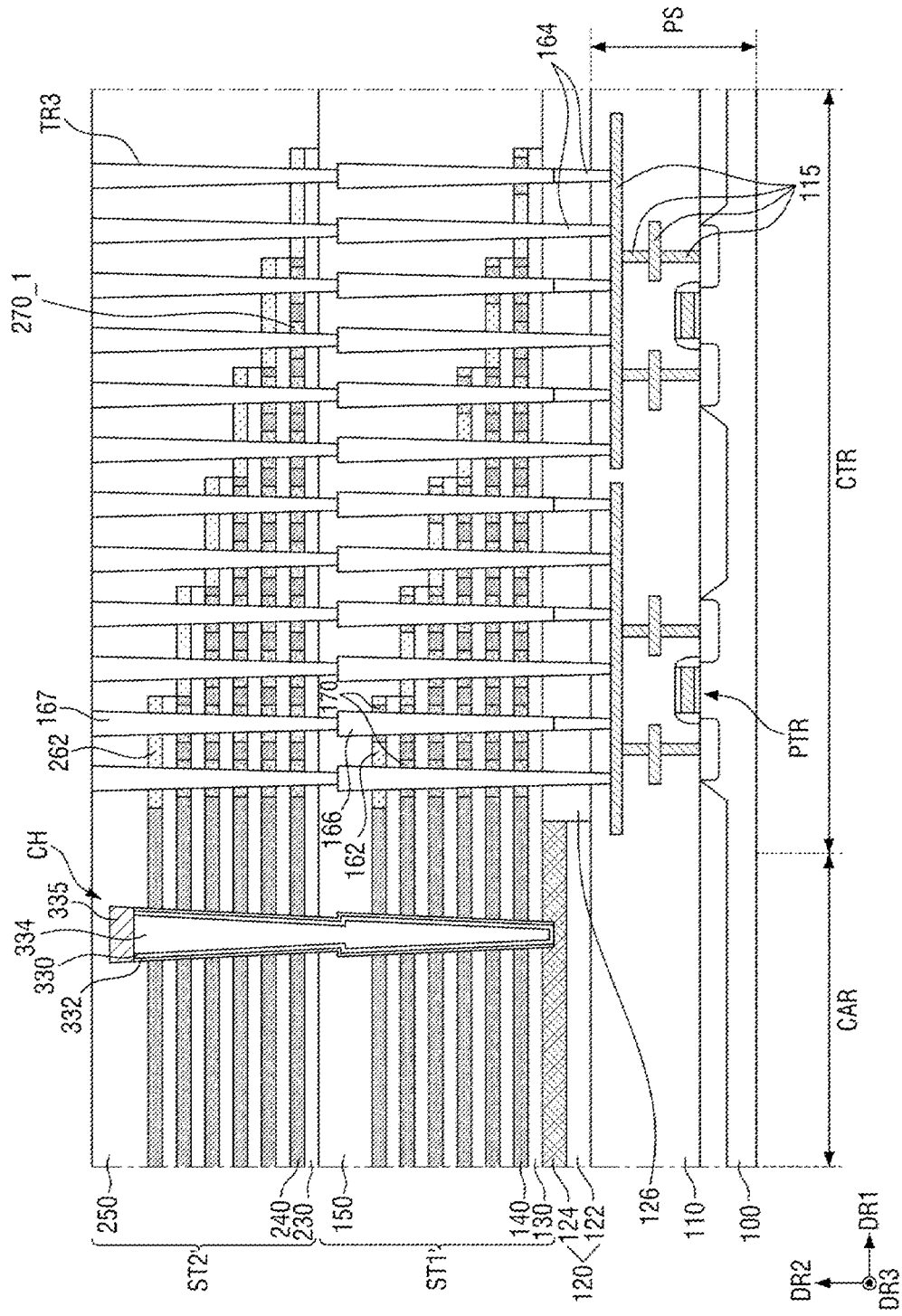

Referring to FIG. 24, a third sacrificial pattern 167 may be formed in the third trench TR3. The third sacrificial pattern 167 may fill the third trench TR3.

Figure 25:
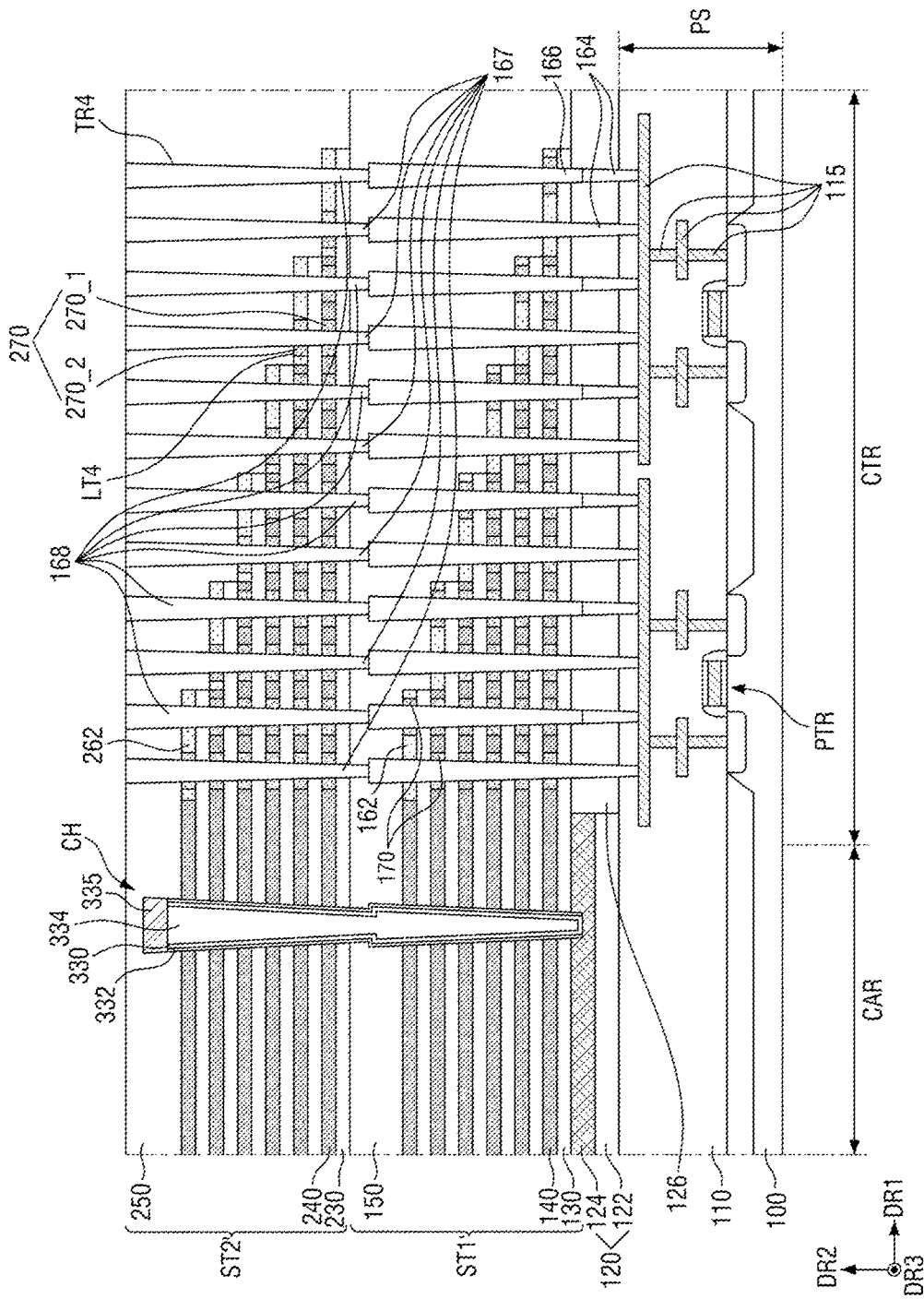

Referring to FIG. 25, a fourth trench TR4 may be formed on the first sacrificial pattern 167. Part of the second impurity region 262 exposed by the fourth trench TR4 may be removed, so that a fourth tunnel portion LT4 may be formed. A fourth sub-insulating region 270_2 may be formed in the fourth tunnel portion LT4. The fourth sub-insulating region 270_2 may fill the fourth tunnel portion LT4. Accordingly, the second insulating region 270 may be formed.

The fourth tunnel portion LT4 and the fourth sub-insulating region 270_2 may be formed by the same method as that for the second tunnel portion LT2 and the second sub-insulating region 170_2 described above with reference to FIG. 20.

Then, a fourth sacrificial pattern 168 may be formed in the fourth trench TR4. The fourth sacrificial pattern 168 may fill the fourth trench TR4.

Figure 26:
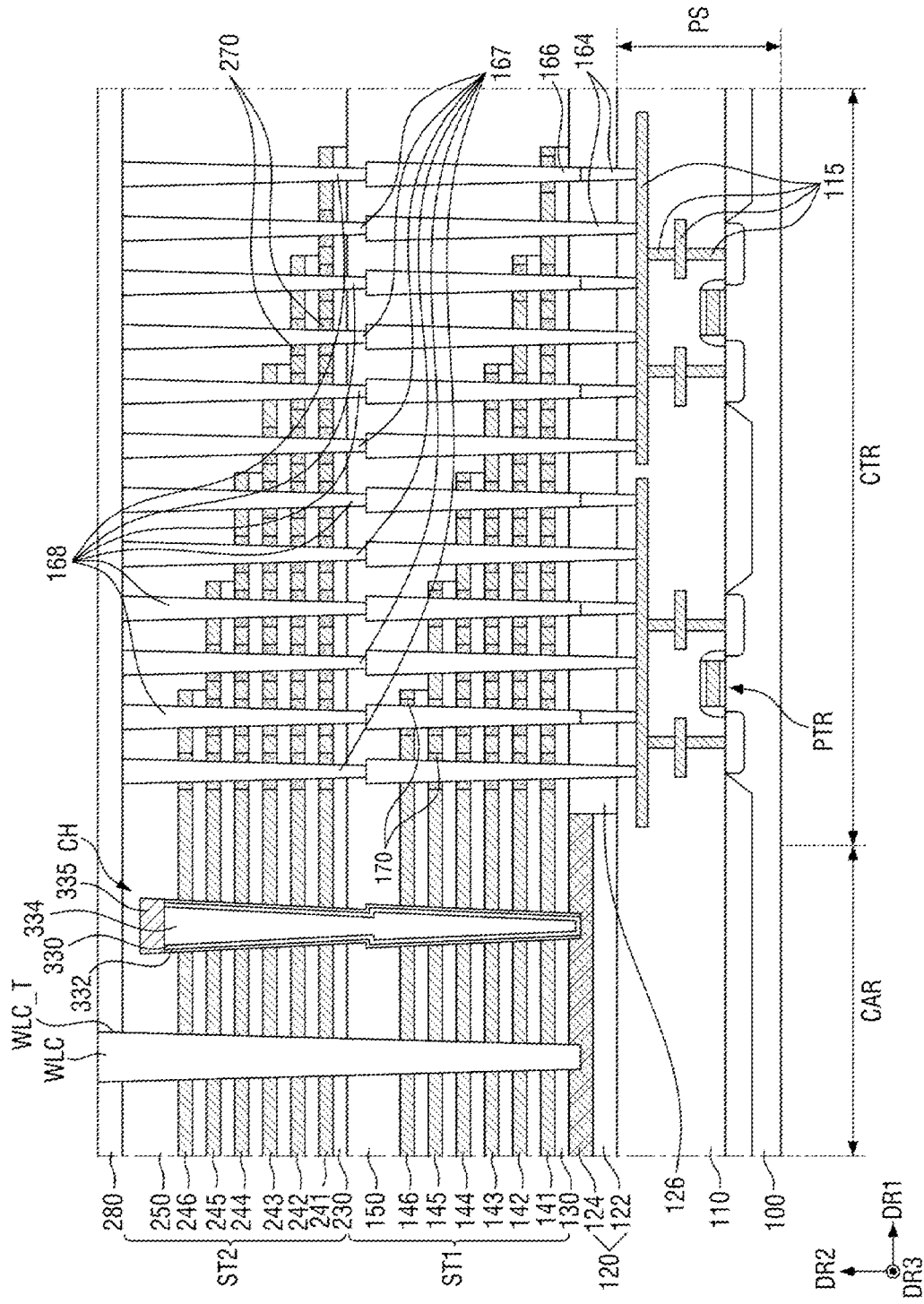

Referring to FIG. 26, a third insulating layer 280 may be formed on the second interlayer insulating layer 250.

Then, a cutting line trench WLC_T penetrating the first and second free stacked structures ST1' and ST2' may be formed on the cell region CAR.

Then, the first and second sacrificial layers 140 and 240 and the first and second impurity regions 162 and 262 may be removed through the cutting line trench WLC_T. The first and second electrode pads 141 to 146 and 241 to 246 may be respectively formed in the spaces where the first and second sacrificial layers 140 and 240 and the first and second impurity regions 162 and 262 are removed.

That is, the first and second sacrificial layers 140 and 240 and the first and second impurity regions 162 and 262 may be respectively replaced by the first and second electrode pads 141 to 146 and 241 to 246 through a replacement metal gate process. Accordingly, the first and second stacked structures ST1 and ST2 may be formed.

Then, a cutting line WLC may be formed to fill the cutting line trench WLC_T.

Then, the third insulating layer 280 may be removed by a planarization process, and an upper portion of the fourth sacrificial pattern 168 may be exposed. The first to fourth sacrificial patterns 164, 166, 167, and 168 may be removed. The first and second contact plugs 310 and 320 may be formed in spaces where the first to fourth sacrificial patterns 164, 166, 167, and 168 are removed.

Then, a third interlayer insulating layer 350, a bit line contact 336, an upper contact 355, a bit line 360, and an upper connection wiring 370 are formed on the second interlayer insulating layer 250. In this manner, the semiconductor memory device illustrated (e.g.) in FIG. 4 may be manufactured.

In concluding this detailed description, it should be noted that those skilled in the art will appreciate that many variations and modifications may be made to the illustrated embodiments without departing from the scope of the inventive concept, as defined by the following claims.

What is claimed is:

1. A semiconductor memory device comprising:
    a first stacked structure on a substrate, the first stacked structure including a cell region and a first staircase portion extending in a first direction;
    a second stacked structure on the first stacked structure, the second stacked structure including a second staircase portion extending in the first direction, the second staircase portion at least partially overlapping the first staircase portion in a second direction;
    a first contact plug on the first staircase portion and the second staircase portion, the first contact plug penetrating the first stacked structure and the second stacked structure and extending in the second direction, wherein the first contact plug is electrically connected to the first stacked structure, and is not electrically connected to the second stacked structure; and
    a second contact plug on the first staircase portion and the second staircase portion, the second contact plug penetrating the first stacked structure and the second stacked structure and extending in the second direction, wherein the second contact plug is electrically connected to the second stacked structure, and is not electrically connected to the first stacked structure.

2. The semiconductor memory device of claim 1, wherein the substrate includes a first surface and an opposing second surface on which the first stacked structure is disposed,
    the first stacked structure includes first electrode pads stacked in the second direction,
    the second stacked structure includes second electrode pads stacked in the second direction,
    the first contact plug is connected to a first electrode pad stacked at an $n^{th}$ position in the second direction from the second surface among the first electrode pads, and
    the second contact plug is connected to a second electrode pad stacked at an $n^{th}$ position in the second direction from the second surface among the second electrode pads.

3. The semiconductor memory device of claim 2, wherein the first contact plug includes first sub-contact plugs spaced apart in the first direction,
    the second contact plug includes second sub-contact plugs spaced apart in the first direction, and
    a first sub-contact plug connected to the first electrode pad stacked at the $n^{th}$ position among the first sub-contact plugs is closest to a second sub-contact plug connected to the second electrode pad stacked at the $n^{th}$ position among the second sub-contact plugs.

4. The semiconductor memory device of claim 1, wherein the first stacked structure includes first electrode pads stacked in the second direction,
    the second stacked structure includes second electrode pads stacked in the second direction,
    the first contact plug includes first sub-electrode plugs spaced apart in the first direction,
    the second contact plug includes second sub-electrode plugs spaced apart in the second direction,
    each of the first electrode pads is electrically connected to an outermost first sub-electrode plug among the first sub-electrode plugs penetrating the first electrode pads, and
    each of the second electrode pads is electrically connected to an outermost second sub-electrode plug among the second sub-electrode plugs penetrating the second electrode pads.

5. The semiconductor memory device of claim 1, wherein the first stacked structure includes first electrode pads stacked in the second direction,
    the second stacked structure includes second electrode pads stacked in the second direction, and
    a lowermost second electrode pad among the second electrode pads extends further in the first direction than an uppermost first electrode pad among the first electrode pads.

6. The semiconductor memory device of claim 1, wherein the first stacked structure includes first electrode pads stacked in the second direction,
    the second stacked structure includes second electrode pads stacked in the second direction,
    the first contact plug is connected to an uppermost first electrode pad among the first electrode pads while penetrating therethrough, and
    the second contact plug is connected to an uppermost second electrode pad among the second electrode pads while penetrating therethrough.

7. The semiconductor memory device of claim 6, wherein each of the first electrode pads includes a first conductive region and a first insulating region,
    each of the second electrode pads includes a second conductive region and a second insulating region,
    the first contact plug penetrates a first conductive region included in the uppermost first electrode pad and a first insulating region included in the first electrode pads disposed below the uppermost first electrode pad, and
    the second contact plug penetrates a second conductive region included in the uppermost second electrode pad and a second insulating region included in the second electrode pads disposed below the uppermost second electrode pad.

8. The semiconductor memory device of claim 7, wherein an outer surface of the first contact plug extends in the first direction in the first conductive region included in the uppermost first electrode pad and the first insulating regions included in the first electrode pads disposed below the uppermost first electrode pad, and
    an outer surface of the second contact plug extends in the first direction in the second conductive region included in the uppermost second electrode pad and the second insulating regions included in the second electrode pads disposed below the uppermost second electrode pad.

9. The semiconductor memory device of claim 6, wherein each of the first electrode pads includes a first portion having a first thickness in the second direction and a second portion having a second thickness greater than the first thickness, and
    the first contact plug penetrates the second portion.

10. The semiconductor memory device of claim 9, wherein each of the second electrode pads has the first thickness in the second direction.

11. The semiconductor memory device of claim 6, wherein the first contact plug further includes a first insulating spacer extending along a sidewall of the first contact plug in the first electrode pads disposed below the uppermost first electrode pad, and
    the second contact plug further includes a second insulating spacer extending along a sidewall of the second contact plug in the first electrode pads.

12. The semiconductor memory device of claim 11, wherein the first contact plug includes a first portion disposed in the first insulating spacer and a second portion not disposed in the first insulating spacer, the second contact plug includes a third portion disposed in the second insulating spacer and a fourth portion not disposed in the second insulating spacer, the first portion and the third portion have a first width in the first direction, and the second portion and the fourth portion have a second width less than the first width.

13. A semiconductor memory device comprising:
a first stacked structure on a substrate, the first stacked structure including a cell region and a first staircase portion extending in a first direction;
a second stacked structure on the first stacked structure, the second stacked structure including a second staircase portion extending in the first direction, the second staircase portion at least partially overlapping the first staircase portion in a second direction; and
a first contact plug and a second contact plug on the first staircase portion and the second staircase portion, the first contact plug and the second contact plug penetrating the first stacked structure and the second stacked structure,
wherein the first stacked structure includes first electrode pads stacked in the second direction, the second stacked structure includes second electrode pads stacked in the second direction, one of the first electrode pads surrounds an outer surface of the first contact plug, and one of the second electrode pads surrounds an outer surface of the second contact plug.

14. The semiconductor memory device of claim 13, wherein each of the first electrode pads includes a first insulating region surrounding the outer surface of the second contact plug, and
each of the second electrode pads includes a second insulating region surrounding the outer surface of the first contact plug.

15. The semiconductor memory device of claim 13, wherein a first electrode pad disposed farthest from the substrate in the second direction among the first electrode pads surrounds the outer surface of the first contact plug, and
a second electrode pad disposed farthest from the substrate in the second direction among the second electrode pads surrounds the outer surface of the second contact plug.

16. The semiconductor memory device of claim 13, wherein a bottom surface of the first contact plug is disposed at a same plane as a bottom surface of the second contact plug.

17. The semiconductor memory device of claim 13, wherein the first contact plug and the second contact plug are alternately disposed in the first direction.

18. A semiconductor memory device comprising:
a peripheral circuit structure including a peripheral circuit; and
a cell array structure including a first stacked structure including a first staircase portion extending in a first direction, a second stacked structure on the first stacked structure, the second stacked structure including a second staircase portion extending in the first direction, the second staircase portion at least partially overlapping the first staircase portion in a second direction, and a first contact plug and a second contact plug on the first staircase portion and the second staircase portion, the first contact plug and the second contact plug penetrating the first stacked structure and the second stacked structure and being connected to the peripheral circuit,
wherein the first contact plug is electrically connected to the first stacked structure and is not electrically connected to the second stacked structure,
the second contact plug is electrically connected to the second stacked structure, and is not electrically connected to the first stacked structure, and
the first contact plug and the second contact plug are alternately disposed in the first direction.

19. The semiconductor memory device of claim 18, wherein the cell array structure further includes a common source plate disposed between the peripheral circuit structure and the first stacked structure and including an opening, and
the first contact plug and the second contact plug are connected to the peripheral circuit through the opening.

20. The semiconductor memory device of claim 18, wherein the peripheral circuit structure includes a first substrate,
the cell array structure includes a second substrate different from the first substrate, and
the peripheral circuit, the first stacked structure, the second stacked structure, the first contact plug, and the second contact plug are disposed between the first substrate and the second substrate.

* * * * *